United States Patent
Sato et al.

(10) Patent No.: US 7,345,411 B2
(45) Date of Patent: Mar. 18, 2008

(54) SURFACE MOUNT TYPE PIEZOELECTRIC VIBRATOR AND MANUFACTURING METHOD OF THE SAME, AN OSCILLATOR WITH THE SURFACE MOUNT TYPE PIEZOELECTRIC VIBRATOR, AN ELECTRONIC UNIT, AND A WAVE CLOCK

(75) Inventors: Masayuki Sato, Chiba (JP); Atsushi Kamiyama, Chiba (JP); Sadao Oku, Chiba (JP)

(73) Assignee: Sieko Instruments Inc. (JP)

( * ) Notice: Subject to any disclaimer, the term of this patent is extended or adjusted under 35 U.S.C. 154(b) by 0 days.

(21) Appl. No.: 11/397,158

(22) Filed: Apr. 4, 2006

(65) Prior Publication Data

US 2007/0080610 A1   Apr. 12, 2007

(30) Foreign Application Priority Data

Apr. 5, 2005   (JP)   .............................. 2005-108979

(51) Int. Cl.
  *H01L 41/047*   (2006.01)
  *H01L 41/053*   (2006.01)
(52) U.S. Cl. .................. 310/365; 310/340; 310/344
(58) Field of Classification Search ............... 310/340, 310/344, 365
  See application file for complete search history.

(56) References Cited

U.S. PATENT DOCUMENTS 6,005,329 A * 12/1999 Ikeda et al. ................. 310/340
6,031,318 A *  2/2000 Sunaga et al. .............. 310/340
2007/0046150 A1 * 3/2007 Uetake et al. ............. 310/344

FOREIGN PATENT DOCUMENTS

| JP | 55-651 | * | 1/1980 | |
|---|---|---|---|---|
| JP | 56-47114 | * | 4/1981 | ................. 310/344 |
| JP | 60-140916 | * | 7/1985 | ................. 310/344 |
| JP | 2001-285010 | * | 10/2001 | |
| JP | 2002-290189 | * | 10/2002 | |

OTHER PUBLICATIONS

Patent Abstracts of Japan, publication No. 2001-077278, publication date Mar. 23, 2001.
Patent Abstracts of Japan, publication No. 2003-032067, publication date Jan. 31, 2003.
Patent Abstracts of Japan, publication No. 2003-023335, publication date Jan. 24, 2003.
Patent Abstracts of Japan, publication No. 11-298279, publication date Oct. 29, 1999.
Patent Abstracts of Japan, publication No. 2002-067081, publication date Mar. 5, 2002.
Patent Abstracts of Japan, publication No. 03-082052, publication date Apr. 8, 1991.

* cited by examiner

*Primary Examiner*—Thomas M. Dougherty
(74) *Attorney, Agent, or Firm*—Adams & Wilks

(57) ABSTRACT

A surface mount type piezoelectric vibrator comprises a piezoelectric vibrator having a piezoelectric vibrating piece bonded to an airtight terminal with a lead terminal and sealed by a cylindrical bottomed metal sealing tube. An electrode terminal is connected to the lead terminal so that a tip of the electrode terminal is disposed approximately at the same position as a tip of the lead terminal in a longitudinal direction of the surface mount type piezoelectric vibrator. The piezoelectric vibrator is coated with a mold resin.

20 Claims, 23 Drawing Sheets

SURFACE MOUNT TYPE PIEZOELECTRIC VIBRATOR AND MANUFACTURING METHOD OF THE SAME, AN OSCILLATOR WITH THE SURFACE MOUNT TYPE PIEZOELECTRIC VIBRATOR, AN ELECTRONIC UNIT, AND A WAVE CLOCK

BACKGROUND OF THE INVENTION

1. Field of the Invention

The present invention relates to a surface mount type piezoelectric vibrator molding a periphery of a piezoelectric vibrator with a resin and a method for manufacturing the same, an oscillator, electronic unit and wave clock having the surface mount type piezoelectric vibrator.

2. Description of the Related Art

Piezoelectric vibrators are indispensable to the production of industrial products such as clocks, oscillators and electronic units, and used as timekeeping sources, timing sources or reference sources for signals. A cylinder-type package is commonly used as a piezoelectric vibrator package.

However, since the cylinder-type package piezoelectric vibrator is cylindrical, the position thereof unstable or two elongate lead terminals are bendable, so that. unlike other electronic parts, the cylinder-type package piezoelectric vibrator cannot be, as it is, surface-mounted using an automatic mounting machine. The cylinder-type package piezoelectric vibrator is covered with resin to allow surface mounting using an automatic mounting machine. This resin-covered type of cylinder-type package piezoelectric vibrator is known as a surface mount type piezoelectric vibrator.

FIG. 36 is a perspective view showing an appearance of a surface mount type piezoelectric vibrator and FIG. 37 is a schematic cross-sectional view showing the inside construction of a surface mount type piezoelectric vibrator with the resin cut off.

As shown in FIGS. 36 and 37, a surface mount type piezoelectric vibrator 31 has a cylinder-type package piezoelectric vibrator 6 provided in the middle. An electrode terminal 33 is provided at the tip side of an outer lead 3 for mounting onto an external substrate. The electrode terminal 33 is formed to extend from a lead frame 60. The electrode terminal 33 is shaped like a crank. One end of the electrode terminal 33 is to be bonded to the outer lead 3 while the other end is to be mounted on a substrate. The electrode terminal 33 is disposed so that the portion that is to be mounted on a substrate is directed outward of the surface mount type piezoelectric vibrator 31.

In the surface mount type piezoelectric vibrator 31, since an electrode terminal 33 is crank-shaped and is provided at the tip side of an outer lead 3 to form a lower electrode terminal 33a, the total length of the surface mount type piezoelectric vibrator 31 is long. That is, the surface mount type piezoelectric vibrator 31 is further longer than the size up to a tip of the outer lead 3 and needs the length up to a tip of the lower electrode terminal 33a, so that the surface mount type piezoelectric vibrator had the problem that the miniaturization of the surface mount type piezoelectric vibrator 31 itself had been inhibited. Recently, the miniaturization of a substrate and the reduction of the mounting area of the surface mount type piezoelectric vibrator have been strongly required due to the progress of the miniaturization of the products using the electronic units.

In order to solve the miniaturization-related problem, the electrode terminal is folded into a u-shape (for example, see FIG. 8 in JP-A-2003-32067) and the direction of the crank-shaped electrode terminal is reverse to that of the surface mount type piezoelectric vibrator 31 shown in FIG. 37 (for example, see FIG. 1 of JP-A-2003-23335).

However, in the u-shaped electrode terminal shown in JP-A-2003-32067, there are the problems as follows:

1. When a part of the lead frame is folded in cross-sectional u-shaped by a press work, each of an upper surface and a back surface are pressed hard with a die and a punch. First, those of the lead frame are folded in L-shape at the first press and next, in u-shape at the second press. However, in the press work that moves the die and punch vertically, a tip of the electrode section and the punch are interfered with each other when secondly folding in cross-sectional u-shape. Accordingly, complicated press equipments are required and it becomes difficult to work the cross-sectional u-shaped electrode terminal by the folding.

2. When using the method of welding by applying voltage for bridging the outer lead in contact with the upper electrode terminal for the electrical continuity, the outer lead and upper electrode terminals need to be in contact with each other between two upper and lower bonding electrodes, while it becomes very difficult that they are disposed between the bonding electrodes in case of the cross-sectional u-shaped electrode terminal. The reason is that the lower electrode terminal is disposed at the reverse side opposite to the outer lead of the upper electrode terminal, whereby it is increasingly difficult that the bonding electrode at the lower side directly supports the lower surface.

3. Since a vertical section between the upper electrode terminal and lower electrode terminal is arranged at the end as the surface mount type piezoelectric vibrator, it is highly possible that a solid resin burr is formed after molding resin. The reason is that in the resin mold forming, attaching a draft angle to the resin mold die is required for good de-molding between an outward form of molded product and a resin mold die and the formation of a gap therebetween is required to evade the contact with the resin mold die and the lead frame. By the necessity of the draft angle and gap, it is highly possible that a solid resin burr is formed on the vertical section. It is difficult to remove the resin burr on the vertical section by means of the general deburring.

Further, as disclosed in JP-A-2003-23335, in case when the direction of the crank-shaped electrode terminal is reverse to the direction of the surface mount type piezoelectric vibrator 31 shown in FIG. 37, there are the problem as follows.

In case of this example, since the lower electrode terminal is overlapped with the piezoelectric vibrator, the expansion section of the sealing tube may be contacted with the lower electrode terminal. If so, the function of the vibrator is hindered due to the short-circuiting of the vibrator. Consequently, so the margin may be given in the height direction as to evade the contact between the sealing tube and the lower electrode terminal, and on the other hand, there is the problem that the height of the body of the surface mount type piezoelectric vibrator increases.

Next, the method for manufacturing the conventional surface mount type piezoelectric vibrator has the following problems.

The process for manufacturing the surface mount type piezoelectric vibrator 31 includes the process for bonding the outer lead 3 of the piezoelectric vibrator 6 to the electrode terminal 33 formed from the lead frame 20, the resin mold process for coating the piezoelectric vibrator 6, the cutting process for pulling out and dropping, from the lead frame 20, a section that joins the resin mold section as the piezoelectric vibrator 6 to the lead frame 20, and the process for electrically testing the surface mount type piezoelectric vibrator 31. First of all, the problems for the respective processes will be described as follows.

[Process for Bonding an Outer Lead to an Electrode Terminal]

In the process for bonding the outer lead 3 of the surface mount type piezoelectric vibrator 31 to the upper electrode terminal 33 by bringing the outer lead 3 into contact with the upper electrode terminal of the electrode terminal 33 for electrical continuity and applying voltage, the piezoelectric vibrator 6 is transferred to each space section inside the lead frame by a predetermined transfer jig capable of conserving the piezoelectric vibrator 6, whereby the bonding is implemented.

FIGS. 38 to 40 show the conventional lead frame. FIG. 38 is a schematic perspective view, FIG. 39 is a fragmentary enlarged view of FIG. 38 and FIG. 40 is a plan view showing the arrangement of the piezoelectric vibrator on the lead frame.

As shown in FIGS. 38 and 39, a lead frame 60 for a conventional surface mount type piezoelectric vibrator has side frames 61 of a carrying and positioning section, section bars 62 and arrangement areas 64 for vibrators 6. These individual components are provided across the width of the lead frame 60 in two rows. Arrangement areas 64 for vibrators 6 are partitioned by a frame 63 for supporting electrode terminals 33 into two rows. Typically, these side frames and sections bars are generically called frame bars.

In the arrangement area 64 for the vibrator 6, a pair of electrode terminals 33 protrude from the side frame 61. A dummy terminal 32 also protrudes from a frame 63 for support the lead frame so that the dummy terminal 32 faces the electrode terminal 33. These terminals, the electrode terminal 33 and the dummy terminal 32, are disposed to face each other across the width of the lead frame 60. As shown in FIG. 35, a plurality of positioning through holes 65 are provided at predetermined intervals in each of the carrying and positioning side frames 61 of the lead frame 60.

The outer lead 3 of the vibrator 6 and the electrode terminal 33 are aligned with the above conventional lead frame 60 for welding purposes in a manner described below. A positioning reference block (not shown) is first prepared. The positioning reference block has a plurality of positioning pins for positioning the lead frame 60 provided to stand up at constant intervals in association with welding positions. The positioning reference block is aligned with the lead frame 60 by inserting the plurality of positioning pins into the plurality of corresponding positioning through holes 65 of the lead frame 60. This causes the outer lead 3 of the vibrator 6 to be aligned with the electrode terminal 33 for welding purposes.

FIG. 41 and FIG. 42 show the process for bonding the conventional piezoelectric vibrator. FIG. 41 is a schematic cross-sectional view and FIG. 42 is a schematic front view from a view of the outer lead side to explain FIG. 41.

As shown in FIG. 41, to weld outer leads 3 of the vibrator 6 to electrode terminals 33, vibrators 6 are then disposed in areas 64 in the lead frame 60 provided for arranging plurality of vibrators 6. The outer lead 3 is then placed on the upper. electrode terminal 33c of the lead frame 60, Welding is performed by placing both the outer lead 3 and the upper electrode terminal 33c between an upper bonding electrode 37 and an lower bonding electrode 36 and applying voltage to the bonding electrodes 36, 37.

In the surface mount type piezoelectric vibrator 31, there is, in particular, the problem that the piezoelectric vibrator 6 is properly aligned with the lead frame 60 by the method for bonding the upper electrode terminal 33c to the above-mentioned outer lead 3. It is necessary to satisfy 3 alignments such as the difference θ in the turning angle of the outer lead 3, a section bonding for the electrical continuity with the outer lead 3 and the position of cutting terminal of the outer lead 3 so as to align the piezoelectric vibrator 6 with the lead frame 60.

In other words, as shown in FIGS. 41 and 42, the alignment of these three points include a turning angle difference θ between a pair of two upper electrode terminals 33c and the outer lead 3, the alignment of a bonding point 33d located in the middle of the upper electrode terminal 33c with a required bonding point in the bent outer lead 3, and the handling of the length of the terminal of the outer lead 3 between the upper electrode terminal 33 and the contour of the piezoelectric vibrator. The alignment of these three points will be described below in detail.

1. The length of the part of the outer lead 3 that protrudes from the airtight terminal 1 is smaller than the contour of the sealing tube 5 of the vibrator 6. Even about a few scores of grams of load also result in the plastic deformation of the outer lead 3. Therefore, it is difficult to regulate the turning angle difference θ for the outer lead 3 with an external force. Although, therefore, the turning angle difference θ for the outer lead 3 is regulated with the dead weight of the vibrator 6, the turning angle difference θ is actually too small for alignment and a required positional accuracy is not met in some cases.

2. The bonding point 33d located in the middle of the electrode terminal 33 is coincided with a required bonding point in the bent outer lead 3. In a process for bending the outer lead 3 in advance, misalignment of the turning angle difference θ for the outer lead 3 results in an insufficient bend in the outer lead 3, thus making impossible the alignment of the required bonding point in some cases.

3. As described earlier, even a small load results in the plastic deformation of the outer lead 3. It is therefore difficult to directly regulate the length and position of the terminal of the outer lead 3 with a jig and the like. Thus, conventional positioning means having a radiused (curved) surface corresponding to the cylindrical side of the vibrator 6 is provided for alignment using the shapes of the sealing tube 5 and the airtight terminal 1 in the longitudinal direction of the vibrator 6. In a process for sealing the sealing tube 5 and the airtight terminal 1, however, there is a dimensional deviation in the longitudinal direction of the vibrator 6 with a resultant deviation in the cutting accuracy for the outer lead 3, thus making the above alignment insufficient in some cases.

Particularly machining using a transfer jig will make it impossible to proceed with subsequent processes properly under any of the above-mentioned situations.

In addition, an insufficient alignment of the sealing tube 5 described above can result in warpage in the lead frame 60 in the longitudinal direction thereof because of the contact of the dummy terminal 32 facing the electrode terminal 33 with the sealing tube 5 on the lead frame 60. Any warpage in the lead frame 60 makes it possible to proceed with subsequent processes properly when the lead frame 60 is mechanically carried and aligned.

In the resin molding process that follows the bonding process described above, an incorrect alignment of the vibrator 6 in molds also results in not only problematic electrode terminal 33 bonding. The incorrect alignment also results the problematic partial exposure of the vibrator 6 from mold resin the resultant incorrect formation of the periphery of the vibrator 6.

[Resin Mold Process]

A conventional resin mold process for a surface mount type piezoelectric vibrator 31 will be described below. A surface mount type piezoelectric vibrator 31 has a sealing tube in the middle thereof. An electrode terminal for mounting on an external substrate is provided on the tip side of an outer lead. The electrode terminal is formed to extend from a lead frame. The electrode terminal is formed like a crank. One end of the electrode terminal is to be bonded to the outer lead 3 while the other end is to be mounted on a substrate. The surface mount type piezoelectric vibrator 31 has the portion to be mounted on a substrate disposed to face outward.

In the resin mold process for the surface mount type piezoelectric vibrator 31, a vibrator 6 is coated with resin mold material at a resin-molded section formed inside a lead frame 60 space. The resin-molded section is formed of molds. The vibrator 6 is held between an upper mold and a lower mold for resin molding.

In a surface mount type package, burrs called place thickness burrs of a lead frame 60 are produced on the sides of the package and prevent an increase in outside dimensions of the package. In the surface mount type package, as shown in FIGS. 38 to 40, it is known that molds for resin mold are placed in blocks each shaped by a side frame 61 and a section bar 62 formed to surround the outside perimeter of the package and a frame 63 for supporting lead terminals for molding to form the shape of the external sides of each package.

Mold resin material is poured into the molds with a piezoelectric vibrator held between a contact portion formed on the top surface of the lower mold and the inside of the upper mold for molding purposes. This forms surface mount type piezoelectric vibrators 31 each having a resin mold portion as shown in FIG. 36 in arrangement areas 64 of the lead frame 60 for a plurality of vibrators.

However, the resin molding process for a conventional surface mount type piezoelectric vibrator 31 has problematic points as described below.

1. The size and arrangement of a mold 66 for molding the periphery of each of vibrators 6 out of resin in the lead frame 60 are as shown in FIG. 43. The mold 66 is long in the longitudinal direction of the lead frame 60.

Each of the vibrators 6 in the lead frame 60 has the longitudinal side thereof disposed across the width of the lead frame 60 as shown in FIG. 40.

The material of the lead frame 60 is conductive material such as an iron-containing alloy. An iron-containing alloy is also used for molds for resin molding. The lead frame 60 and these molds are made of the same iron-containing materials. However, each of these materials has a different coefficient of linear expansion. In resin molding, the mold 66 for resin molding and the lead frame 60 are heated to temperatures between 150 and 180° C.

The difference in coefficient of linear expansion between the mold 66 for resin molding and the lead frame 60 causes a misalignment between the mold 66 for resin molding and the lead frame 60. The misalignment appears in the longitudinal direction of the lead frame 60 can easily appear across the width of the surface mount type piezoelectric vibrator 31.

The contour of the resin-molded surface mount type piezoelectric vibrator 31 and the shape of the electrode terminal 33 in the lead frame 60 causes misalignment therebetween due to the above-mentioned difference in coefficient of linear expansion from the center of the surface mount type piezoelectric vibrator 31 and across the width thereof. The misalignment results in a difference in size of the electrode terminal 33 across the width of the surface mount type piezo electric vibrator 31. In the electrode terminal 33 cutting process after the resin molding process, the ends of electrode terminal 33 are cut off from the lead frame 60. The difference in size of the electrode terminal 33 across the width of the surface mount type piezoelectric vibrator 31 can cause contact of a cutting punch with the mold resin thereof, thus resulting in problematic resin chips due to lead cutting. As described above, the resin chipping resulting from resin molding has an adverse influence on the product performance of the surface mount type piezoelectric vibrator 31.

2. The electrical test process for the surface mount type piezoelectric vibrator 31 have required more measurement time because of measurement items for guaranteeing performance characteristics of the surface mount type piezoelectric vibrator 31 and a measurement accuracy in recent years. Much time is therefore spent on the electrical test. Individual surface mount type piezoelectric vibrators 31 are problematically difficult to handle so as to guarantee the performance characteristics thereof.

To ensure the characteristics and reliability of the surface mount type piezoelectric vibrator 31, a resin mold construction is therefore required for the surface mount type piezoelectric vibrator 31. The resin mold construction would allow measurements of the surface mount type piezoelectric vibrator 31 on the lead frame 60 in the electric test and the simultaneous quick batch measurements of more surface mount type piezoelectric vibrators 31. The time reduction would enable resulting saved time to be allocated to measurements for performance characteristic measurement items for measurement accuracy guarantee, thus making it possible to ensure a higher reliability and a higher quality.

3. For the above purpose, a higher cavity density is required for the resin mold construction, which would allow electrical tests performed on the lead frame 60 and allow for the layout of the lead frame 60 for simultaneous batch contact of more electrode terminals. However, the higher cavity density would result in a problematically complicate mold for the resin mold construction.

In other words, contact surface of the mold are inserted between the resultant outer peripheral portion of the above-mentioned resin mold construction to be shaped to enclose the vibrator 6 and the side of the vibrator 6. The outer peripheral portion shaped to enclose the vibrator 6 to support the positional accuracy of a terminal formation portion is to be disposed on the side of the vibrator 6 as a frame 63 for supporting the section bar 62 and the lead terminal. In the mold 66 for forming cavities, therefore contact surfaces between the outer peripheral portion to be shaped to enclose the vibrator 6 and the side of the vibrator 6 and between a section bar 62 and the mold 66 are formed for each cavity. Resin burrs resulting from resin molding include thin burrs produced on the sides of the package and the top surface of the lead frame from a mold clamping clearance between the upper mold and lower mold. To allow the removal of these thin burrs, a mold clamping clearance accuracy is required, as far as thin burrs can be removed, in a position where the contour of the package is to be shaped and in positions of section bars 62. To make a plurality of adjacent cavities closer to one another for a higher cavity density, a sufficient strength is therefore required for narrower section bars 62 and the mold. The mold must also be of a complicated shape that would avoid the shape of section bars 62 together with the maintenance of the accuracy of individual mold clamping clearances.

[Process for Cutting Electrode Terminal Portions]

In a process for cutting electrode terminal portions, each of the dummy terminals 32 and the electrode terminals 33 connecting to the surface mount type piezoelectric vibrators 31 on the lead frame 60 are cut in predetermined positions. This separates individual surface mount type piezoelectric vibrators 31 from the lead frame 60.

In the process for cutting electrode terminal portions of the surface mount type piezoelectric vibrator 31, a notch groove is sometime formed in advance in each cutting point in advance for cutting load reduction. As an adverse influence of this, warpage in the lead frame 60 sometimes results. In other words, the formation of notch grooves in the lead frame 60 can lead to the expansion of notch groove formation surfaces, thus resulting in warpage in these surfaces. Any warpage in the lead frame 60 will make it impossible to proceed with subsequent processes properly when the lead frame is mechanically carried and aligned.

[Electrical Test Process]

An electrical test process for the surface mount type piezoelectric vibrator 31 has required more measurement time in response to measurement items for guaranteeing performance characteristics of the surface mount type piezoelectric vibrator 31 and a measurement accuracy in recent years. Much time is therefore spent on the electrical test.

The electrical test process involves separating individual surface mount type piezoelectric vibrators 31 from the lead frame 60 after resin mold and carrying, positioning and electrically inspecting individual surface mount type piezoelectric vibrator 31 to distinguish between non-defective and defective vibrators. Characteristics of surface mount type piezoelectric vibrators 31 are classified according to users' applications.

Surface mount type piezoelectric vibrators 31 are loaded on tapes and the like according to types such as different load capacity as serial equivalent static capacity and frequency deviation, which completes the surface mount type piezoelectric vibrator 31 manufacturing process.

The longer measurement time is, the more accurate frequency measurements for vibrators 6 will be, whereby the higher the accuracy required is, the longer measuring time will therefore be. It is required to give an assurance whose reliability or quality is improved by assigning reduced time to the measurement time for guaranteeing the measurement items and measurement accuracy of the performance characteristics guarantee so as to secure performance characteristics and reliability of the surface mount type piezoelectric vibrator 31 in case that much time is therefore spent on the test time and the individual translation alignment due to the increase of the measurement time by the measurement items and measurement accuracy for guaranteeing the performance characteristics of the surface mount type piezoelectric vibrator 31.

For the electrical test method described above, a method is known which involves bringing electrical contact terminals into contact with the electrode terminals for simultaneous batch electronic part measurement.

In the electrical test process of the surface mount type piezoelectric vibrator 31, there are the following problems in relation to, in a lump, measuring the surface mount type piezoelectric vibrator 31 by bridging the electrode terminal 33 in electrical continuity particularly with the outer lead 3.

1. A limited number of electronic parts are measured all together in the electrical test method that involves bringing electrical contact terminals into contact with electronic parts mounted in a row on the side frame at a right angle.

2. As shown in FIGS. 38 and 40, on a conventional lead frame 60, piezoelectric vibrators 6 are mounted in two rows at a right angle to the longitudinal direction of two side frames 61 (in the vertical direction in FIG. 40). This requires section bars 62 bridging between the side frames 61 or the frame 63 for supporting lead terminals, and the like. As shown in FIG. 40, there is a limit to the arrangement of piezoelectric vibrators 6 at shorter intervals for a higher density and a limited number of piezoelectric vibrators 6 are measured all together.

3. If, on the other hand, a plurality of surface mount type piezoelectric vibrators 31 are arranged at shorter intervals for a high density and driven to oscillate, the oscillating condition of adjacent surface mount type piezoelectric vibrators 31 and their intervals can affect their oscillation frequency.

FIG. 44 is a diagram showing the oscillation circuit of a common piezoelectric vibrator. CS, represented by a dashed line, refers to stray capacity. FIG. 45 is a graph showing a relation between the load capacity of a common piezoelectric vibrator and frequency deviation. The axis of abscissas CGOUT shows a load capacity while the axis of ordinates shows frequency deviation. It is well known that the oscillation frequency varies with the magnitude of the capacitor CG in FIG. 44, as in the graph shown in FIG. 45. It is also well known that the stray capacity is proportional to the area of wiring connected with the oscillation circuit and inversely proportional to the distance.

It is known from the above fact that the frequency of piezoelectric vibrators 6 also vary between adjacent surface mount type piezoelectric vibrators 31 to be measured in the electrical test process for surface mount type piezoelectric vibrators 31. The distance between adjacent surface mount type piezoelectric vibrators 31 has a different influence on the frequency of the surface mount type piezoelectric vibrator 31. If an attempt is made to meet the necessity of enhancing the layout density of the lead frame relative to the lead frame 60 on which more electrical contact terminals are brought into contact with electronic parts as described above, piezoelectric vibrators 6 can be affected by the influence of the frequencies of piezoelectric vibrators 6 oscillating each other due to the distance between adjacent surface mount type piezoelectric vibrators 31, thus making it difficult to make correct frequency measurements.

SUMMARY OF THE INVENTION

The object of the present invention is to provide a small-sized surface mount type piezoelectric vibrator with reduced mounting area, easy production and low cost in light of the above-mentioned conventional problems.

Furthermore, the object of the present invention is to provide a manufacturing method for a surface mount type piezoelectric vibrator that allows the maximization of electrical contact terminals brought into contact with surface mount type piezoelectric vibrators having two-directional lead terminals arranged in short pitches on a section bar and arranged in a matrix on a lead frame with high density through the effective use of a width ⅓ to ⅕ smaller than a length and the simultaneous measurement of these vibrators all together with a quick measurements of individual vibrators, in an electrical test process of a surface mount type piezoelectric vibrator manufacturing process. It is also to provide a manufacturing method for a surface mount type piezoelectric vibrator manufacturing process that makes it possible to simultaneously testing more of the surface mount type piezoelectric vibrators with electrical contact terminals in contact with a plurality of surface mount type piezoelectric vibrators arranged with high density without repeated electrical contact terminal contacts, and without any influence on the frequency of adjacent vibrators, and allocate resulting saved time to measurements for performance characteristic measurement items for measurement accuracy guarantee, thus allowing reliability and quality improvements and uses the lead frame.

In addition, the object of the present invention is to provide an oscillator, an electronic unit and a wave clock each using a surface mount type piezoelectric vibrator according to the invention.

To achieve the above objects, the present invention includes the solving means described below.

According to a first aspect of the invention a surface mount type piezoelectric vibrator includes a piezoelectric vibrator having a piezoelectric vibrating piece bonded to an airtight terminal with a lead terminal and sealed by a cylindrical bottomed metal sealing tube, an electrode terminal connected to an external electrode to provide electrical continuity with the lead terminal, and mold resin for coating the piezoelectric vibrator, wherein a tip of the lead terminal to the lengthwise direction of the piezoelectric vibrator is arranged in almost the same position as a tip of a lower electrode formed in parallel to a lower section.

In the configuration according to the first aspect of the invention, the position, a tip of the lead terminal to the lengthwise direction of the piezoelectric vibrator is arranged in almost the same position as a tip of a lower electrode formed in parallel to a lower section, whereby a small-sized surface mount type piezoelectric vibrator can be provided while the electrical insulation is secured without making the lower electrode terminal come close to the cylindrical bottomed metal sealing tube.

That is, in the lower electrode terminal of the lead frame, when the bendable section is arranged inside the body of the surface mount type piezoelectric vibrator, since the protruding of the lower electrode terminal in the longitudinal direction of the body of the surface mount type piezoelectric vibrator can be controlled to a minimum, the miniaturization in the longitudinal direction is acquired, whereby the mounting area can be reduced.

According to a second aspect of the invention, the surface mount type piezoelectric vibrator is characterized that a longitudinal cross section in the longitudinal direction of the piezoelectric vibrator is u-shaped in the first aspect of the invention.

In the configuration according to the second aspect of the invention, the electrode terminal is formed in cross-sectional u-shape in the longitudinal direction of the piezoelectric vibrator from a sheet of lead frame, whereby a small-sized surface mounting piezoelectric vibrator can be provided while the electrical insulation is secured without making the lower electrode terminal of simple structure come close to the cylindrical bottomed metal sealing tube.

According to a third aspect of the invention, the surface mount type piezoelectric vibrator wherein the electrode terminal further has a vertical section of an electrode terminal formed on the piezoelectric vibrator side to a longitudinal direction of the piezoelectric vibrator in the lower electrode terminal and an upper electrode terminal formed on a top side of the vertical section of the electrode terminal parallel to a direction far away from the piezoelectric vibrator to a longitudinal direction of the piezoelectric vibrator in the first aspect or second aspect of the invention.

In the configuration according to the third aspect of the invention, since the upper electrode terminal electrically connected with the lead terminal of the piezoelectric vibrator is formed on the top side of the vertical section parallel to the direction far away from the piezoelectric vibrator to the longitudinal direction of the piezoelectric vibrator, the bendable section of the upper electrode terminal comes close to the piezoelectric vibrator and an end section of the upper electrode terminal is arranged far away from the piezoelectric vibrator. Accordingly, when the lead terminal of the piezoelectric vibrator is electrically connected to the upper electrode terminal, the end section of the upper electrode terminal can be prevented from contacting to the piezoelectric vibrator, so that there is not damaged a periphery section of the piezoelectric vibrator body on the end section of the upper electrode terminal.

According to a fourth aspect of the invention, the lower electrode terminal and upper electrode terminal of the surface mount type piezoelectric vibrators are not overlapped with each other in the width direction of the piezoelectric vibrator.

In the configuration according to the fourth aspect of the invention, since the lower electrode terminal and upper electrode terminal are not overlapped with each other in the widthwise direction of the piezoelectric vibrator, it is possible to catch each full surface of the lower electrode terminal or upper electrode terminal in a die directly. In other words, it is possible to bridging the die, punch and bonding electrode on the surfaces of the upper electrode and lower electrode, so that the shape of the electrode terminal can be easily formed or the lead terminal can be easily bonded. Hence, the good small-sized surface mount type piezoelectric vibrator that can be stably manufactured through the process for bending and working the electrode terminal, the process for bonding by a bonding jig.

According to a fifth aspect of the invention, there is the surface mount type piezoelectric vibrator arranged in the central axis of the piezoelectric vibrator closer than the lower electrode terminal with reference to the position about the widthwise direction of the piezoelectric vibrator on the upper electrode terminal in the fourth aspect of the invention.

According to a sixth aspect of the invention, the method of the surface mount type piezoelectric vibrator for manufacturing the surface mount type piezoelectric vibrator by using the lead frame, wherein the lead frame includes a pair of side frames having a plurality of alignment holes, respectively, a section bar bridging a pair of side frames, a frame area divided by the side frames and the section bar, a plurality of first lead sections installed by arranging in a predetermined interval and extending from the section bar, and a plurality of second lead sections installed by facing the first lead section, wherein the electrode terminal is formed on the second lead section in the first aspect to the fifth aspect.

In the manufacturing method according to a sixth aspect of the invention, when the surface mount type piezoelectric vibrator is manufactured by using the lead frame, since a plurality of first lead sections and the corresponding second lead sections face each other in one frame area of the lead frame, and a plurality of second lead sections are provided, whereby the electrode terminal of the surface mount type piezoelectric vibrator, a gap of the surface mount type piezoelectric vibrator adjacent to each other can be narrowed, so that the number of surface-mount type piezoelectric vibrators per unit area can be further augmented.

According to a seventh aspect of the invention, there is a method for manufacturing the surface mount type piezoelectric vibrator having a dummy terminal provided in the first lead section in the sixth aspect of the invention.

In the manufacturing method according to the seventh aspect of the invention, a gap between the surface mount type piezoelectric vibrators having the dummy terminal adjacent to each other is narrowed, whereby the further augmented number of surface mount type piezoelectric vibrators per unit area can be manufactured.

In the sixth aspect and seventh aspect, since there is no framework for supporting the individual lead sections, only the first and second lead sections can be provided in the frame area divided by the side frame and section bar, the lead frame capable of the frame area is provided.

The first and second lead sections are arranged in the widthwise direction of the lead frame to the longitudinal direction of the lead frame, and maintained by the section bar. The lead sections are formed in a minimum construction with no wasteful frame. A surface mount type piezoelectric vibrators characterized by a small width that is ⅓ to ⅕ of the length L thereof are directed to the longitudinal direction of the lead frame and arranged in the widthwise direction of the lead frame, whereby the surface mount type piezoelectric vibrators can be arranged in a matrix with high density.

In the lead frame area, only the first and second lead sections of a minimum construction are provided. A gap between the plurality of adjacent cavities forming the periphery section with the shape surrounding the surface mount type piezoelectric vibrator can be narrowed, whereby the resin mold construction with a higher cavity density capable of being batched in a high density can be achieved without complicating a mold die.

The longitudinal directions of the first and second lead sections and the cavities are directed toward the side frame while the piezoelectric vibrators are arranged in the direction of the section bar. This makes difficult for surface mount type piezoelectric vibrators to be influenced by mold center misalignment, which conventionally occurs the longitudinal direction of the side frame. Therefore, a lead frame can be provided that have a resin mold construction that allows the elimination of resin chipping resulting from lead cutting in a process for cutting the first and second lead sections. Resin chipping is caused by the above center misalignment for surface mount type piezoelectric vibrators.

Further, since the surface mount type piezoelectric vibrator having two-directional lead terminal can be, arranged in a matrix with high density throughout the lead frame, and arranged in short pitches on a section bar with a minimum construction without a wasteful frame, the number of electrical contacting terminals bridged can be maximized and measured in a lump.

According to an eighth aspect, the method for manufacturing the surface mount type piezoelectric vibrator has a bonding process that bonds the lead terminal and the upper electrode terminal by attaching the upper electrode terminal to provide electrical continuity with the lead terminal and applying a voltage, which includes holding the lead terminal to a rectangular thin plate having a plurality of cutting sections with almost the same as the diameter of the lead terminal, arranging the upper electrode terminal of the lead frame formed in the upper electrode terminal and the lead terminal of the piezoelectric vibrator loaded in the rectangular thin plate at the same position, piling the lead terminal on the upper electrode terminal, and transferring the position of the lead terminal to the upper electrode terminal to be bonded in the sixth or seventh aspect of the invention.

In the method for manufacturing the surface mount type piezoelectric vibrator according to the eighth aspect, the airtight terminal bonded between cut sections with the same diameter as the outer lead is conserved by holding for preventing the movement from a carriage pallet. The interval of the cut sections is arranged wider than the width of the piezoelectric vibrator for the pairs at least 2 sections of the rectangular thin plates, since the difference of the turning angle can minimized, the required position accuracy of the outer lead can be satisfied.

In other words, a small of the position of the outer lead results in the plastic deformation of the outer lead with a small load, thus making it difficult to control the turning angle with a direct external force. However, the turning angle for the outer lead is controlled by means of cuts disposed at intervals each larger than the width of the piezoelectric vibrator. This allows the turning angle for the outer lead to be controlled relative to the contour of the sealing tube of the piezoelectric vibrator, thus making it possible to meet required positional accuracy.

The position accuracy of the cut section of the rectangular thin plate inserted with the outer lead can be easily formed by the general high-precision processing machine capable of acquiring the processing accuracy of μms such as the die size and the position accuracy requiring the alignment by means of the cut section can be satisfied therein. In addition, since the turning angle of the outer lead and the position accuracy of the cut section on the rectangular thin plate enable acquiring the high accuracy, the molding can be made to the shape required for the bending of the outer lead, whereby the required number of bonding sections after the molding can be coincident.

The outer lead bonded and arranged on the rectangular thin plate aligns the high-precision rectangular thin plate for the lead frame on which the dummy terminal and electrode terminal are formed with high precision. By this configuration, the accuracy for the sealing tube contour of the piezoelectric vibrator is secured, whereby a bad effect on the bending status of the lead frame by the wasteful contact of the sealing tube contour with the lead frame can be prevented. By bridging the outer lead aligned with high precision, the outer lead of the piezoelectric vibrator can be bonded through the proper positioning on the lead frame.

The outer lead of the piezoelectric vibrator loaded on the rectangular thin plate is arranged in the same position as the electrode terminal of the lead frame and the plurality of outer lead arranged is simultaneously aligned in high precision by one-time alignment of the rectangular thin plate. Transferring the position of the outer lead to the electrode terminal to be bonded repetitively enables simultaneously high-precision and stable bonding.

Further, the shape capable of aligning the rectangular thin plate is very suitable for the machine process by using the transfer jig.

According to a ninth aspect of the invention, the method for manufacturing the surface mount type piezoelectric vibrator includes forming the plurality of cavities putting resin within the frame area divided into the pair of side frames and the section bar on a die, the resin mold process for molding the periphery of the piezoelectric vibrator with resin, and resin-molding respective longitudinal directions of the piezoelectric vibrator, lead frame and die in the sixth aspect or seventh aspect of the invention.

In the manufacturing method according to the ninth aspect of the invention, the resin mold structure with the arrangement of high-density cavity and effective space can be formed by densifying the pitch between adjacent cavities without complicating the die.

That is to say, only the first and second lead sections are provided in the frame area of the lead frame partitioned by the side frame and the section bar. There are no other frames between surface mount type piezoelectric vibrators disposed in the frame area on a lead frame having a minimum configuration. Therefore, molds having the plurality of cavities can make the most of the space in the frame area. With no other frames, the cavities are connected with one another through a single flat surface. Adjacent cavities are provided at short pitches and the first and second lead sections are directed in the direction of the side frame with the cavities disposed in the longitudinal direction thereof. This permits surface mount type piezoelectric vibrators to be arranged with good space efficiency, which vibrators characteristically has a width that is $\frac{1}{3}$ to $\frac{1}{5}$ smaller than a length. Injection molding ports are provided toward the first and second lead sections at a runner disposed on the section bar. This allows the formation of a mold construction that provides the largest cavity density and resin use rate with the shortest runner per cavity on the section bar having a minimum configuration with no wasteful frames.

Further, the first and second lead sections and the longitudinal direction of the cavities are in the direction of the side frame while the piezoelectric vibrators are arranged in the direction of the section bar. This permits mold center misalignment to appear in the misalignment-insensitive longitudinal direction of the surface mount type piezoelectric vibrator, while mold center misalignment conventionally appears in the longitudinal direction of the side frame. Therefore, a resin mold construction can be provided that can eliminate resin chipping due to the center misalignment for the surface mount type piezoelectric vibrator in the process for cutting the first and second lead sections.

According to a tenth aspect of the invention, the method for manufacturing the surface mount type piezoelectric vibrator has an electrical test process that includes cutting the plurality of second lead sections after the resin mold process, supporting the surface mount type piezoelectric vibrator in the plurality of first lead sections, applying a predetermined first drive voltage to every other surface mount type piezoelectric vibrator not adjacent to the plurality of surface mount type piezoelectric vibrator, applying a second drive voltage other than the predetermined first drive voltage to every other surface mount type piezoelectric vibrator adjacent to the surface mount type piezoelectric vibrator to which the predetermined first drive voltage is applied, and changing the applying the first and second voltage alternatively in the ninth aspect of the invention.

In the manufacturing method according to the tenth aspect of the invention, the surface mount type piezoelectric vibrator has characteristically a width that is $\frac{1}{3}$ to $\frac{1}{5}$ smaller than the length thereof. Each of the surface mount type piezoelectric vibrators has two-directional terminals: one terminal functions as an electrode terminal and the other is an electrically completely independent dummy terminal. The surface mount type piezoelectric vibrators can be arranged with short pitches on the section bar having a minimum configuration with no wasteful frame, in a matrix with high density over the entire lead frame. This is preferable for bringing the largest possible number of electrical contact terminals into contact with the piezoelectric vibrators. This allows more electrical contact terminals to be brought into contact with these piezoelectric vibrators simultaneously and enables the surface mount type piezoelectric vibrators to be electrically tested all together with quick testing for each of the vibrators.

A plurality of surface mount type piezoelectric vibrators are arranged in short pitches on the section bar, and arranged in a matrix on the lead frame with high density. Drive voltage is applied and the plurality of surface mount type piezoelectric vibrators with electrical contact terminals in contact with the surface mount type piezoelectric vibrators without repeated electrical contact terminal contacts. A level of the drive voltage for driving every other of the surface mount type piezoelectric vibrators is alternately changed to alternately perform an electrical test on the every other of the surface mount type piezoelectric vibrators. This makes it possible to greatly reduce electrical test time for the surface mount type piezoelectric vibrators without any influence on the frequency of adjacent vibrators.

In other words, the surface mount type piezoelectric vibrator moves to a normal frequency after a slight vibration much quickly than reaches a stable frequency after the start of drive voltage application. With this characteristic, the adjacent surface mount type piezoelectric vibrator is caused to continue to drive with slight vibrations at a low level of drive voltage applied to prevent the surface mount type piezoelectric vibrator being measured from being affected by the frequency of the adjacent one. The use of a normal drive voltage application level allows the reduction of time before frequency stabilization. Resulting saved time can be allocated to measurement items for performance characteristic guarantee and measurement accuracy, thus allowing the manufacture of the surface mount type piezoelectric vibrators with improved reliability and quality.

According to an eleventh aspect of the invention, the surface mount type piezoelectric vibrator of any of the first to fifth aspects is connected, as an oscillation piece, to an integrated circuit to form an oscillator.

According to a twelfth aspect of the invention, an electronic unit is characterized that the surface mount type piezoelectric vibrator is connected to a timing section in some of the first to fifth aspects of the invention.

According to a thirteenth aspect of the invention, a wave clock is characterized that the surface mount type piezoelectric vibrator is connected to a filter section in some of the first to fifth aspects of the invention.

As described above, according to the invention, a tip of the lead terminal to the lengthwise direction of the piezoelectric vibrator is arranged in almost the same position as a tip of a lower electrode formed in parallel to a lower section, so that the tip is prevented from expanding from the upper electrode terminal to the outward side of the body of the vibrator. Accordingly, a small-sized surface mount type piezoelectric vibrator can be provided while the electrical insulation is secured without making the lower electrode terminal come close to the cylindrical bottomed metal sealing tube. Further, since the upper electrode terminal is arranged inside as compared to the lower electrode terminal in the width direction of the surface mount type piezoelectric vibrator body without overlapping with the lower electrode terminal in the vertical direction, a surface mount type piezoelectric vibrator which can reduce its mount area, can be easily manufactured and can be manufactured at low cost.

Furthermore, by the maximization of electrical contact terminals brought into contact with surface mount type piezoelectric vibrators having two-directional lead terminals arranged in short pitches on a section bar, and arranged in a matrix on the lead frame with high density through the effective use of a width $\frac{1}{3}$ to $\frac{1}{5}$ smaller than a length and the simultaneous measurement of these vibrators all together with a quick measurements of individual vibrators, in an electrical test process of a surface mount type piezoelectric vibrator manufacturing process, there can be provided the method for manufacturing a surface mount type piezoelectric vibrator that makes it possible to simultaneously testing more of the surface mount type piezoelectric vibrators with electrical contact terminals in contact with a plurality of surface mount type piezoelectric vibrators arranged with high density without repeated electrical contact terminal contacts, and without any influence on the frequency of adjacent vibrators, and allocate resulting saved time to measurements for performance characteristic measurement items for measurement accuracy guarantee, thus allowing reliability and quality improvements and uses the lead frame.

BRIEF DESCRIPTION OF THE DRAWINGS

FIG. 23A shows the method for applying the bonding voltage as shown in FIG. 6 and FIG. 23B is a right side view of the piezoelectric vibrator of FIG. 23A.

DESCRIPTION OF THE PREFERRED EMBODIMENTS

Figure 1:
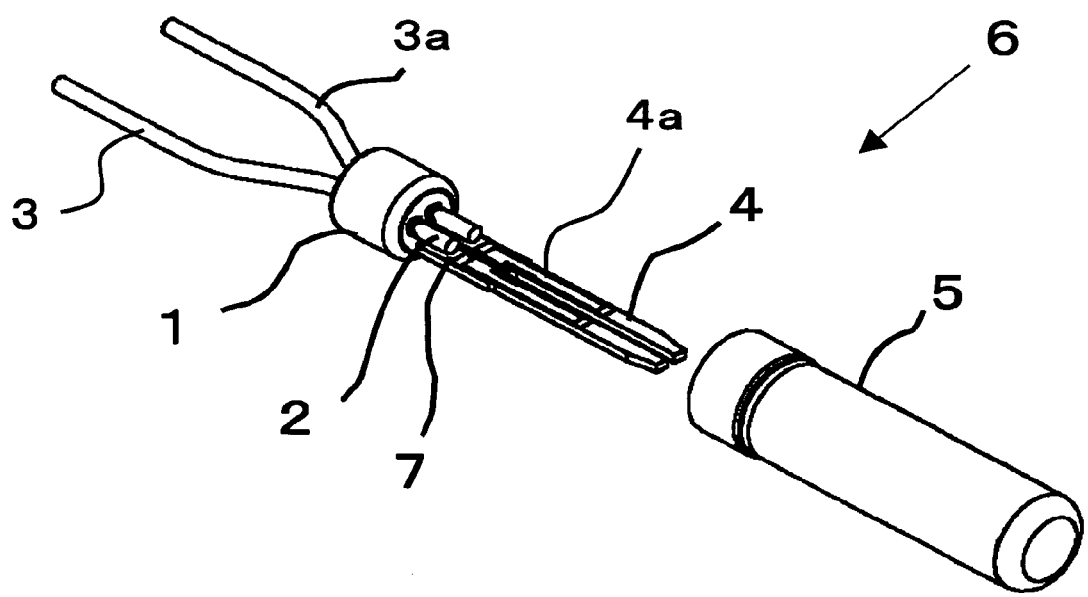
FIG. 1 is a schematic perspective view showing the construction of a cylinder-type package piezoelectric vibrator.

Hereinafter, the specific embodiments very suitable for a surface mount type piezoelectric vibrator of the present invention will be described below with reference with the drawings. First, a cylinder-type package piezoelectric vibrator will be described. FIG. 1 is a schematic perspective view showing the construction of the cylinder-type package piezoelectric vibrator used for the surface mount type piezoelectric vibrator.

As shown in FIG. 1, a cylinder-type package piezoelectric vibrator 6 has a piezoelectric vibrating piece 4 bonded to an inner lead 2 inside an airtight terminal 1 having two lead terminals. The piezoelectric vibrating piece 4 is made of piezoelectric material such as quartz crystal and formed to be shaped like a tuning fork through photolithography technology. The tuning-fork type piezoelectric vibrating piece 4 is formed with an exciting electrode 4a on the surface of each of two vibrating arm portions thereof. A mount electrode 7 connected to the exciting electrode 4a is formed on the surface of the airtight terminal 1 side of the piezoelectric vibrating piece 4.

The piezoelectric vibrating piece 4 is bonded to the inner lead 2 inside the airtight terminal 1 through the mount electrode 7. The inner lead 2 passes through the airtight terminal 1, serving as an outer lead 3. The inner lead 2 and the outer lead 3 together is referred to as a lead terminal. At the outside perimeter of the airtight terminal 1, the tuning-fork type piezoelectric vibrating piece 4 is covered with a cylindrical bottomed metal sealing tube 5 so that the airtight terminal 1 is airtight sealed to form a vacuum inside.

When a predetermined voltage, as a drive voltage, is applied to the two outer leads 3, the cylinder-type package piezoelectric vibrator configured as described above permits current to flow from the inner lead 2 through the mount electrode 7 to the exciting electrode 4a. This thus causes the piezoelectric vibrating piece 4 to oscillate at a predetermined frequency.

The specific embodiments of the surface mount type piezoelectric vibrator using the above-mentioned cylinder-type package piezoelectric vibrator will be described with reference to the drawings.

First Embodiment

First, the construction of the surface mount type piezoelectric vibrator will be described with reference to FIGS. 2 to 6.

Figure 2:
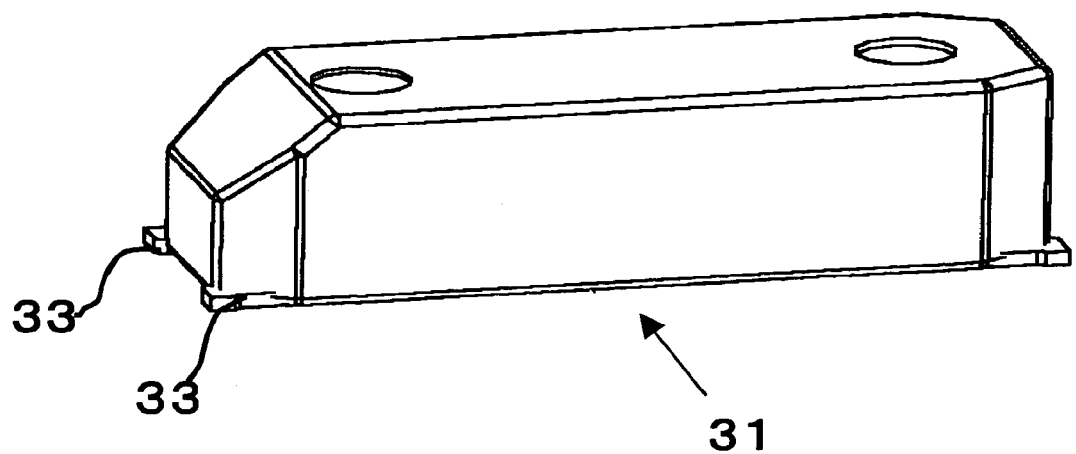
FIG. 2 is a schematic perspective view showing an appearance of the surface mount type piezoelectric vibrator related to the first embodiment.
Figure 3:
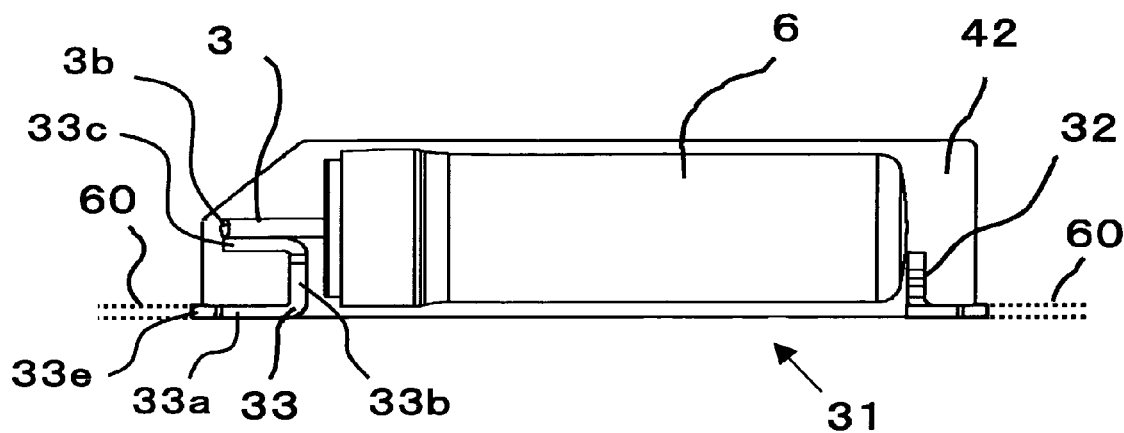
FIG. 3 is a schematic cross-sectional view of an inner part of the surface mount type piezoelectric vibrator related to the first embodiment.
Figure 4:
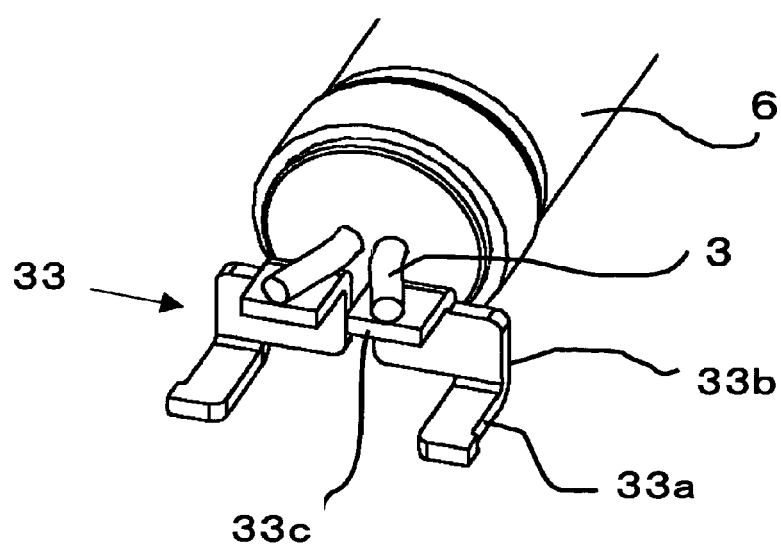
FIG. 4 is a schematic perspective view showing the electrode terminal of the surface mount type piezoelectric vibrator related to the first embodiment.
Figure 5:
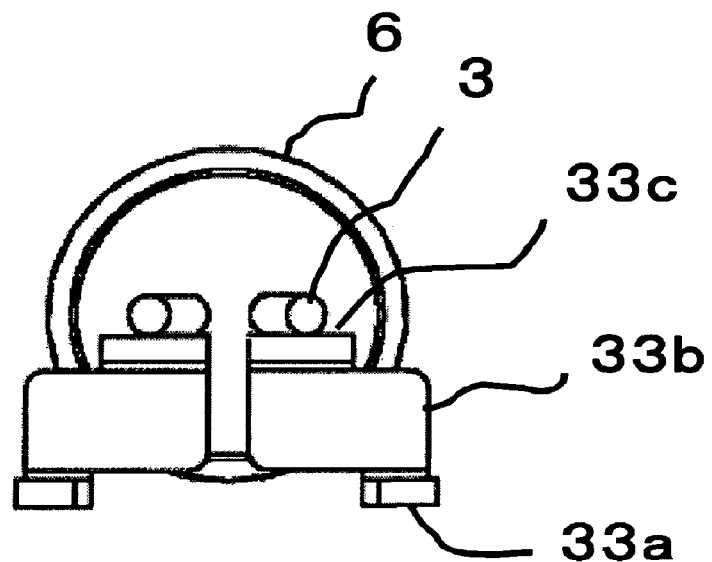
FIG. 5 is a schematic side view showing the electrode terminal shown in FIG. 4.
Figure 6:
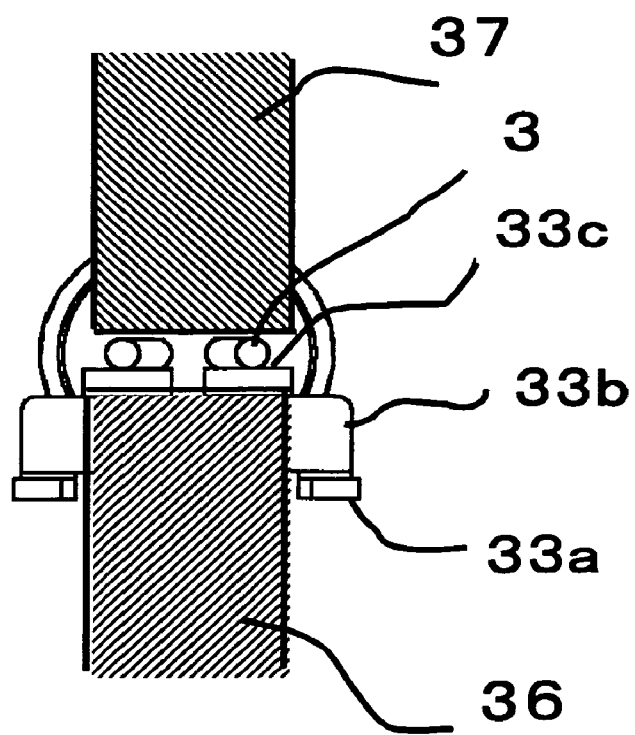
FIG. 6 is a schematic side view showing the bonding process of the outer lead and electrode terminal.

FIG. 2 is a schematic perspective view showing an appearance of the surface mount type piezoelectric vibrator related to the first embodiment. FIG. 3 is a schematic cross-sectional view of an inner part in a cross-sectional view of mold resin of the surface mount type piezoelectric vibrator related to the first embodiment. FIG. 4 is a schematic perspective view showing the electrode, terminal of the surface mount type piezoelectric vibrator related to the first embodiment. FIG. 5 is a schematic side view showing the electrode terminal shown in FIG. 4. FIG. 6 is a schematic side view showing the bonding process of the outer lead and electrode terminal.

Since the cylinder-type package piezoelectric vibrator 6 has a cylindrical appearance, thereby not showing an unstable posture, it is difficult to mount the cylinder-type package piezoelectric vibrator on an external print substrate like other electronic units. Therefore, as shown in FIGS. 2 and 3, the periphery of the piezoelectric vibrator 6 is molded with resin, whereby the surface mount type piezoelectric vibrator 31 with substantially rectangular appearance is formed. Accordingly, since the surface mount type piezoelectric vibrator 31 can be easily stable, it is possible to mount the surface mount type piezoelectric vibrator 31 through the reflow treatment with other electronic units.

An inner lead 2 bonded to a mount electrode 7 of the piezoelectric vibrating piece 4 shown in FIG. 1 passes an airtight terminal 1 capable of endure an insulating material mounted in an expansion section of the piezoelectric vibrator 6 and turns up as an outer lead 3 as shown in FIGS. 3 and 4. The outer lead 3 shown is bonded to an electrode terminal 33 chopped out to the outside of the piezoelectric vibrator 6 as shown in FIGS. 3 and 4. The electrode terminal 33 is chopped out from one end of a resin mold section 42 to the outside.

In other words, the entirety including the piezoelectric vibrator 6 housing the piezoelectric vibrating piece 4 and the outer lead 3 is molded with a predetermined molding material, for example, resin material such as epoxy type molding material, etc. as described hereinafter. It is constituted of the surface mount type piezoelectric vibrator 31.

As shown in FIG. 3, the electrode terminal 33 is a part thereof and the lower electrode terminal 33a parallel thereto is chopped out to a bottom face of the surface mount type piezoelectric vibrator 31. In addition, the electrode terminal 33 has the vertical section 33b characterized that an inside (piezoelectric vibrator 6) of a longitudinal direction of the surface mount type piezoelectric vibrator 31 on the lower electrode terminal 33a is bent perpendicular to the upper side.

As shown in FIG. 4, the electrode terminal vertical section 33b is extended to the inward direction of the widthwise direction of the body of the surface mount type piezoelectric vibrator 31 (direction to the inside diameter direction from the outside diameter direction of the piezoelectric vibrator 6) and has the width size larger than that of the lower electrode terminal 33a. The upper electrode terminal 33c is formed on the upper part of the electrode terminal vertical section 33b.

The upper electrode terminal 33c is disposed in the inside of the widthwise direction of the body of the surface mount type piezoelectric vibrator 31 on the electrode terminal vertical section 33b and is formed by being bent to the horizontal direction outward the longitudinal direction of the surface mount type piezoelectric vibrator 31 the opposite side of the piezoelectric vibrator 6.

As described above, the electrode terminal 33 is a electrode terminal wherein a longitudinal cross section of the surface mount type piezoelectric vibrator 31 is u-shaped having 2 horizontal sections (lower electrode terminal 33a and upper electrode terminal 33c) and the vertical section (electrode terminal vertical section 33b) inserted therein to as shown in FIG. 3 and FIG. 4.

The electrode terminal vertical section 33b of the cross-sectional u-shaped electrode terminal 33 is formed more adjacent to the piezoelectric vibrator 6 than the tip 3b of the outer lead 3. Further, each tip of 2 horizontal section (lower electrode terminal 33a and upper electrode terminal 33c) formed by being bent from the electrode terminal vertical section 33b is formed at much the same position as the tip 3b of the outer lead 3 in the longitudinal direction of the body of the surface mount type piezoelectric vibrator.31. Accordingly, though the lower electrode terminal 33a is not disposed just below the sealing tube 5 of the piezoelectric vibrator 6, the longitudinal size of the surface mount type piezoelectric vibrator 31 can be reduced with the electrical insulation secured.

Figure 37:
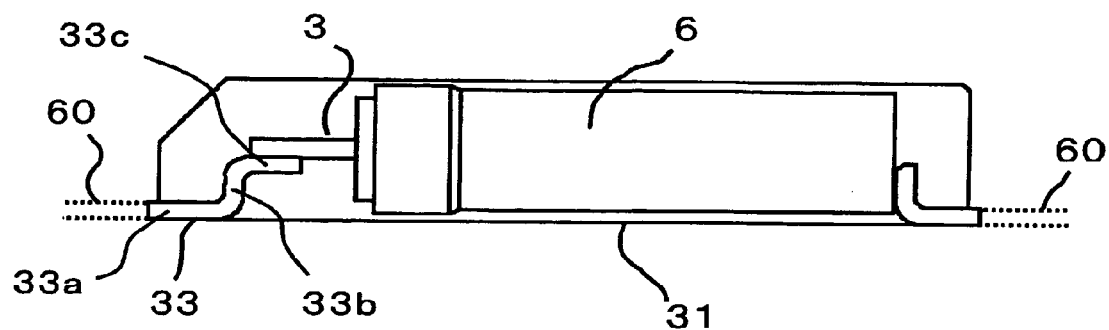
FIG. 37 is a schematic cross-sectional view showing the internal structure of the surface mount type piezoelectric vibrator.
Figure 38:
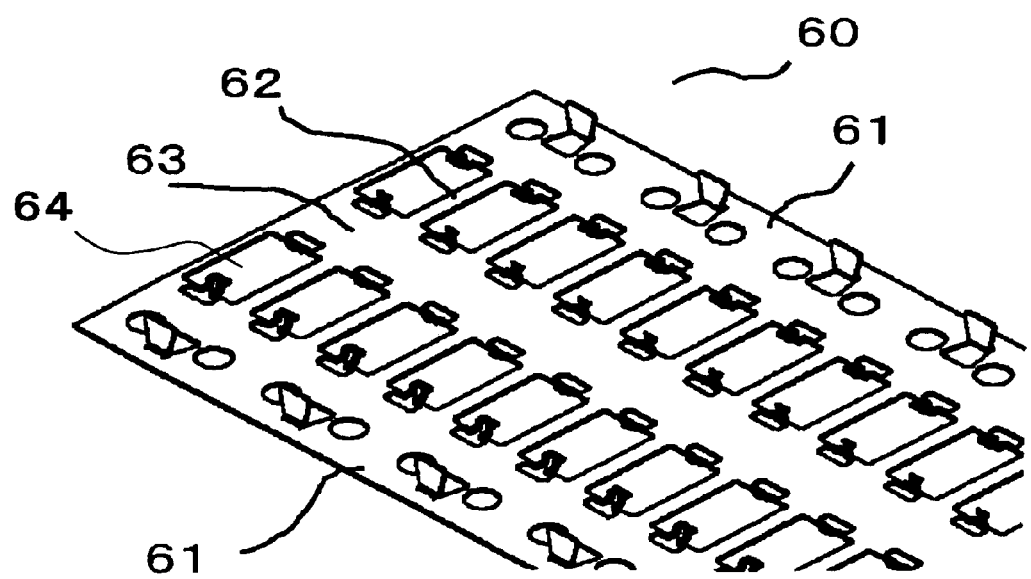
FIG. 38 is a schematic perspective view showing the conventional lead frame.
Figure 39:
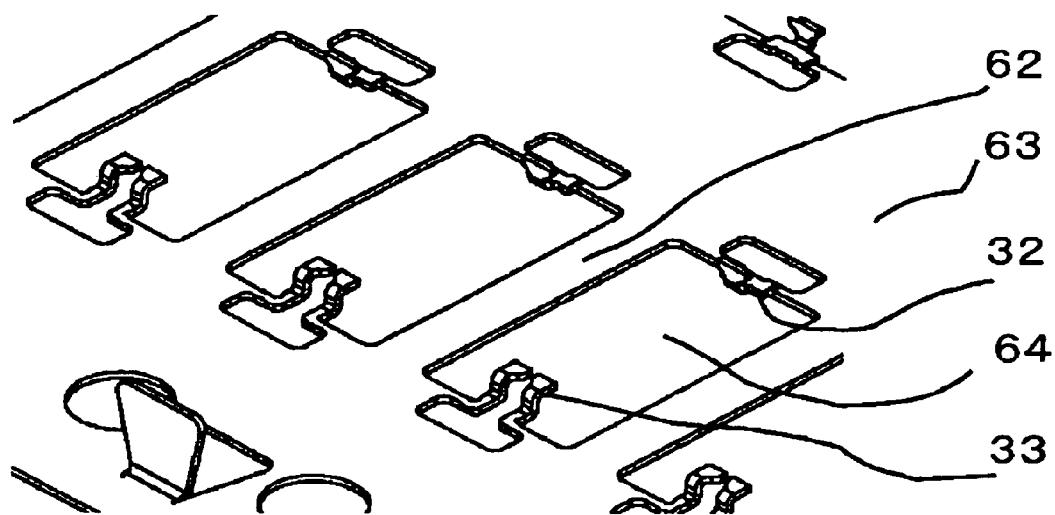
FIG. 39 is a partial enlarged view of the lead frame shown in FIG. 38.
Figure 40:
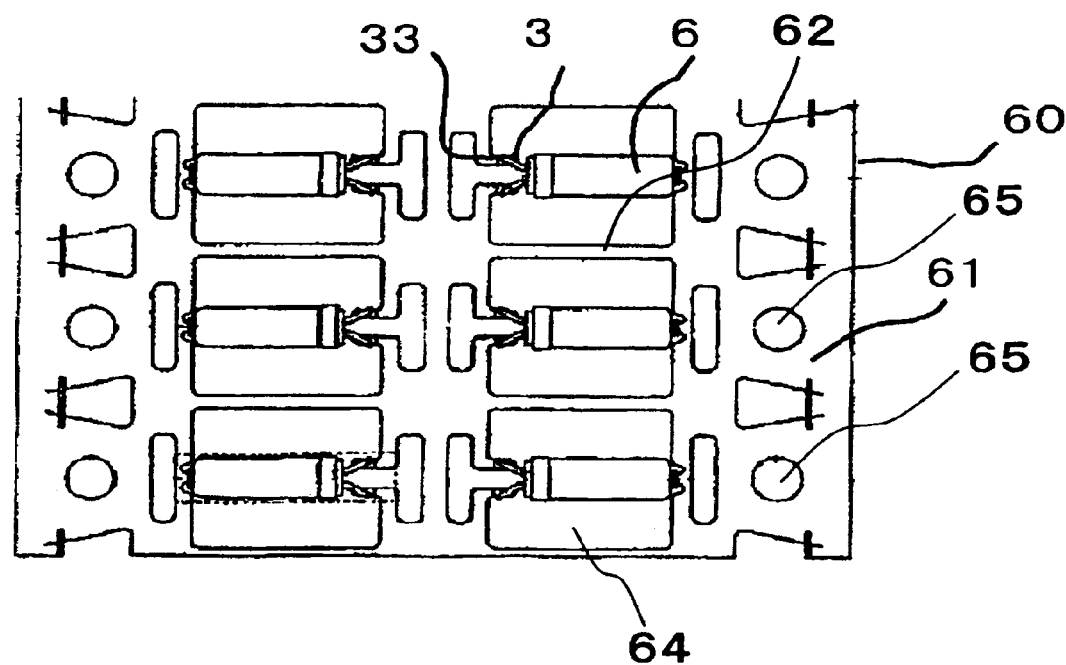
FIG. 40 is a plan view showing the arrangement of the piezoelectric vibrator on the conventional lead frame.
Figure 41:
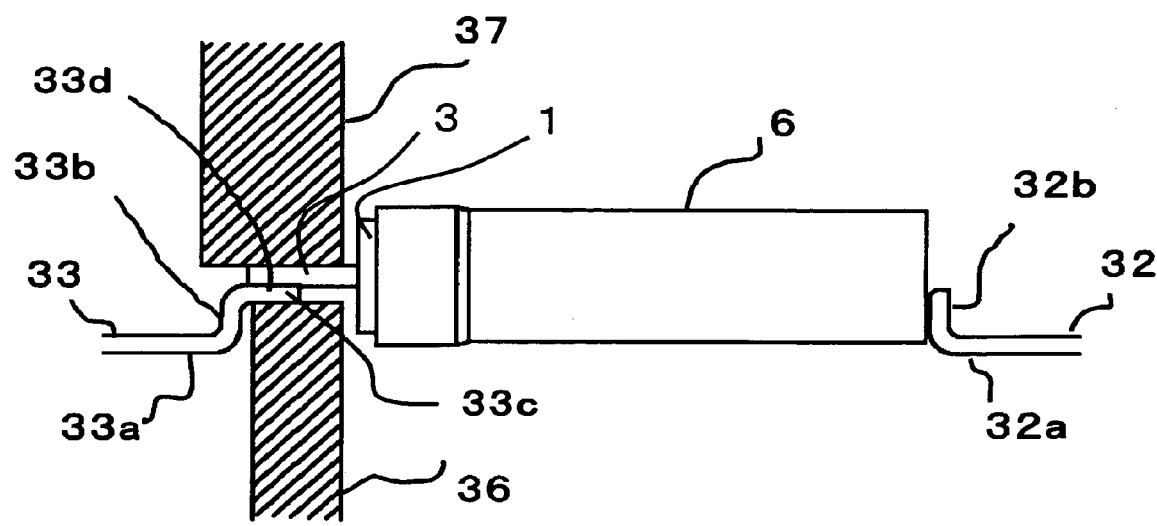
FIG. 41 is a schematic cross-sectional view showing the bonding state in the bonding process of the conventional outer lead and electrode terminal.
Figure 42:
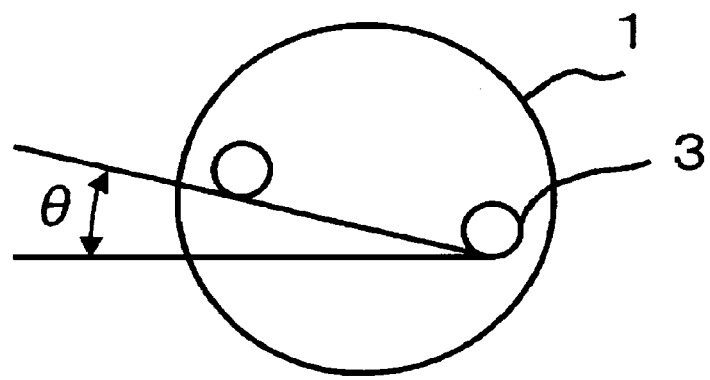
FIG. 42 is a schematic front view from a view of the outer lead side for describing the bonding process shown in FIG. 41.
Figure 43:
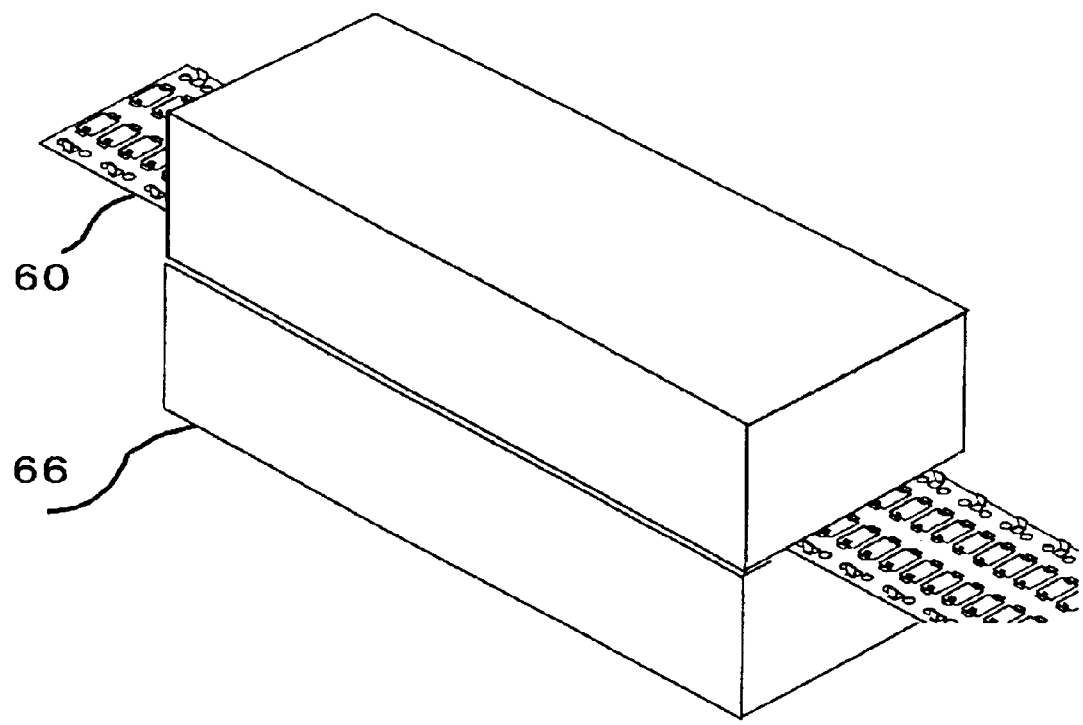
FIG. 43 is a schematic enlarged perspective view for describing the shape and arrangement of the conventional lead frame and die.
Figure 44:
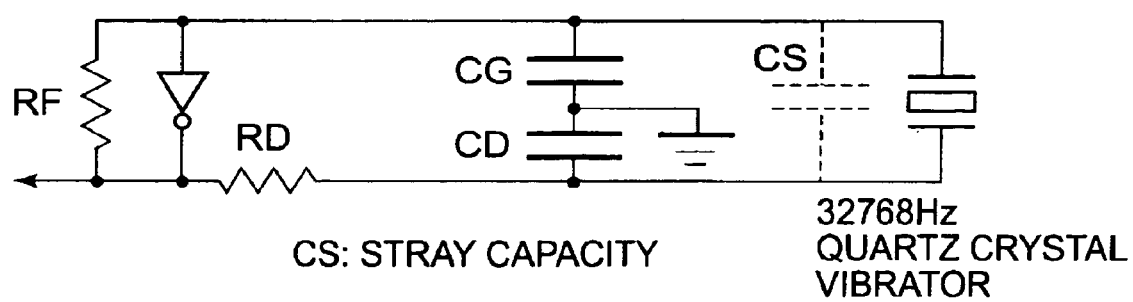
FIG. 44 is an oscillation circuit diagram of the piezoelectric vibrator.
Figure 45:
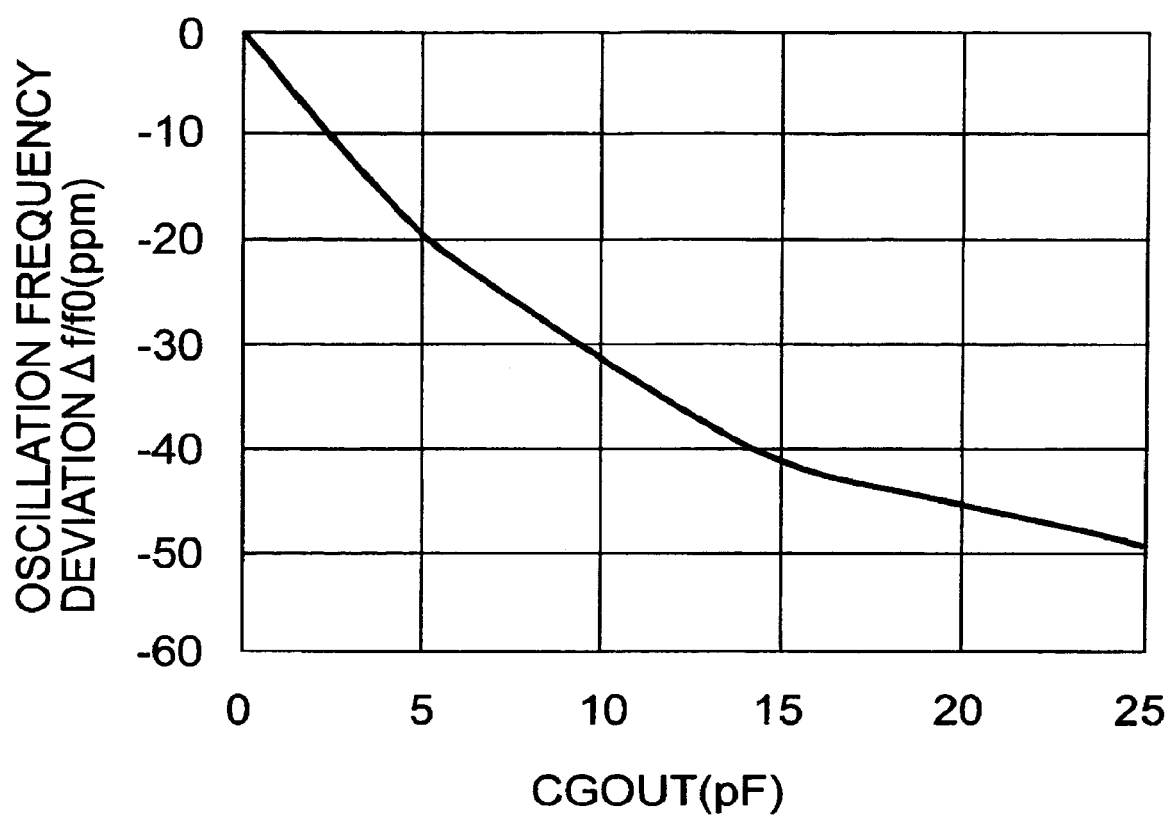
FIG. 45 is a graph showing the relationship of the load capacity and frequency deviation of the piezoelectric vibrator.

In the lower electrode terminal 33a, when the bendable section is arranged inside the body of the surface mount type piezoelectric vibrator 31, the protruding of the lower electrode terminal 33a in the longitudinal direction of the body of the surface mount type piezoelectric vibrator 31 can be controlled to a minimum. This protruding amount is remarkably smaller than that of the electrode terminal 33 of the conventional surface mount type piezoelectric vibrator 31 shown in FIG. 37. Consequently, the reduction of the surface mount type piezoelectric vibrator 31 in the longitudinal direction after molding resin is acquired, whereby the mounting area can be reduced.

The upper electrode terminal 33c is provided in the widthwise direction (radial direction of the piezoelectric vibrator 6) of the body of the surface mount type piezoelectric vibrator 31 insider than the lower electrode terminal 33a as shown in FIG. 5. That is, the upper electrode terminal 33c is disposed without the overlapping of the upper side and lower side for the lower electrode terminal 33a. Accordingly, when the electrode terminal 33c is bent in relation to the electrode terminal processing formation on the lead frame, the upper electrode terminal 33c can be securely put between a die and a punch directly. In addition, while the bending process, the upper side and lower side of the lower electrode terminal 33a also can be securely put between the die and punch directly. As a result, it becomes easy to process and form the electrode terminal on the lead frame.

Further, the lower electrode terminal 33a and upper electrode terminal 33c are disposed without the overlapping of the upper side and lower side. As shown in FIG. 6, in relation to the bonding process with the upper electrode terminal 33c to the outer lead 3, the upper bonding electrode 37 can be directly contacted to the outer lead 3 and simultaneously the lower bonding electrode 36 can be directly to the reverse-face of the upper electrode terminal 33c.

Further, the outer lead 3 and the upper electrode terminal 33c are pressed from the upper and lower side with a predetermined weight and a predetermined voltage is applied to the lower bonding electrode 36 and the upper bending electrode 37. As a result, as shown FIG. 4, the upper electrode terminal 33c is bonded to the outer lead 3. This will be, in detail, described by the process for bonding the electrode terminal 33 to the outer lead 3 afterwards.

Contrary to the above configuration in the electrode terminal 33 side, a dummy terminal 32 is formed on the other side of the surface mount type piezoelectric vibrator 31 to be protruded from the resin mold section 42 as shown in FIG. 3. This dummy terminal 32 is not electrically contacted with the piezoelectric vibrating piece 4.

Since the piezoelectric vibrator 6 housing the piezoelectric vibrating piece 4 is mold-formed by the resin mold section 42, the part of this surface mount type piezoelectric vibrator 31 can be mechanically mounted by an automatic mounting machine like the surface mount type parts such as semiconductor parts. In addition, a predetermined lands on a mounting substrate (not shown) are fixed by mounting and soldering both the dummy terminal 32 and the electrode terminal 33. Accordingly, the oscillation occurs in a predetermined resonance frequency by applying a drive voltage to the piezoelectric vibrating piece 4 from an outer lead 3 and an inner lead 2 by inserting the substrate and electrode terminal 33 within the mounting equipment. Further, this oscillation can be used for a predetermined clock signal of the equipment using the oscillation.

Figure 7:
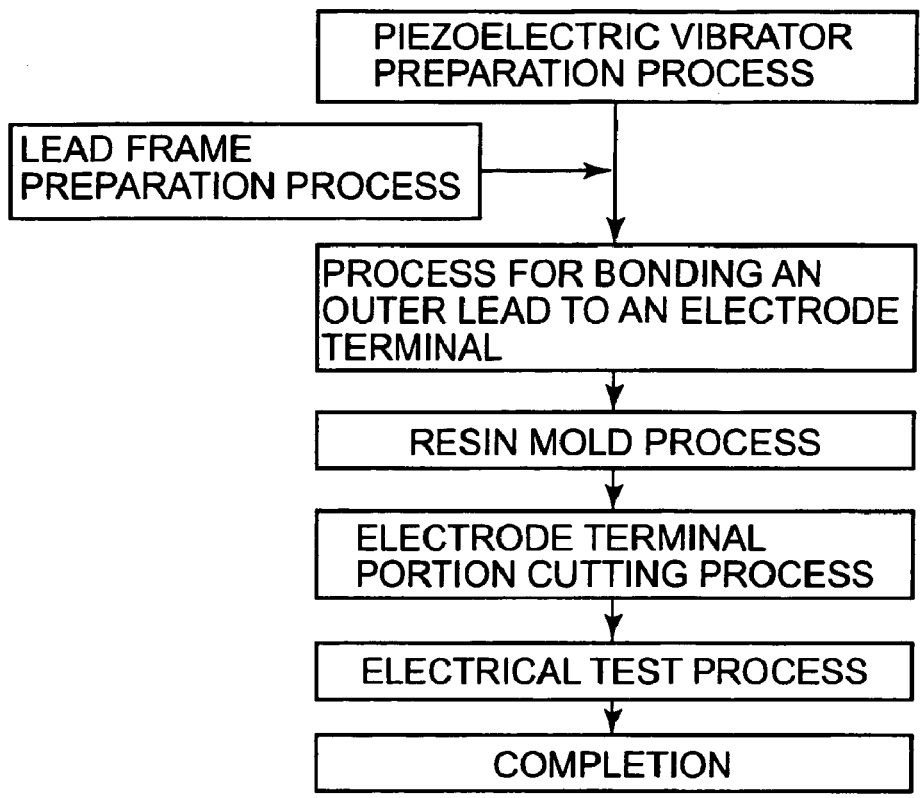
FIG. 7 is a flow chart schematically showing the manufacturing process of the surface mount type related to the first embodiment.

Hereinafter, the embodiment of the manufacturing process of the surface mount type piezoelectric vibrator according the invention will be described with reference to the drawings. FIG. 7 is a flow chart schematically showing the manufacturing process of the surface mount type related to the first embodiment. First, for understanding of the embodiment, this process will be concisely described.

1. Piezoelectric vibrator preparation process: Quartz crystal pieces are formed of piezoelectric material through cutting and polishing. An electrode film required for each quartz crystal piece to operate as a piezoelectric vibrator is formed on each of the front and back surfaces thereof to form a piezoelectric vibrating piece. The piezoelectric vibrating piece is bonded to each airtight terminal attached to a carriage pallet for piezoelectric vibrators. A carriage pallet is prepared for completed piezoelectric vibrators each sealed in a sealing tube.

2. Lead frame preparation process: A lead frame with electrode terminals formed is prepared, which are to be bonded to outer leads of piezoelectric vibrators.

3. Process for bonding an outer lead to an electrode terminal: The outer lead of each piezoelectric vibrator is bonded to the lead frame with electrode terminals formed.

4. Resin molding process: Each of the piezoelectric vibrators on the lead frame is molded out of resin using predetermined material to form a surface mount type piezoelectric vibrator.

5. Electrode terminal portion cutting process: Each electrode terminal portion is inserted into a notch groove and soldering is performed on the electrode. Each electrode terminal portion is then cut off from the lead frame with dummy terminals left on the lead frame.

6. Electrical test process: An electrical contact terminal is brought into contact with each of the surface mount type piezoelectric vibrators on the lead frame, which are electrically independent of the lead frame for an electrical test.

Each of the surface mount type piezoelectric vibrators are completed as a product through these processes.

The surface mount type piezoelectric vibrator manufacturing method will be described in further detail in terms of each of the above-mentioned processes.

[Piezoelectric Vibrator Preparation Process]

Figure 8:
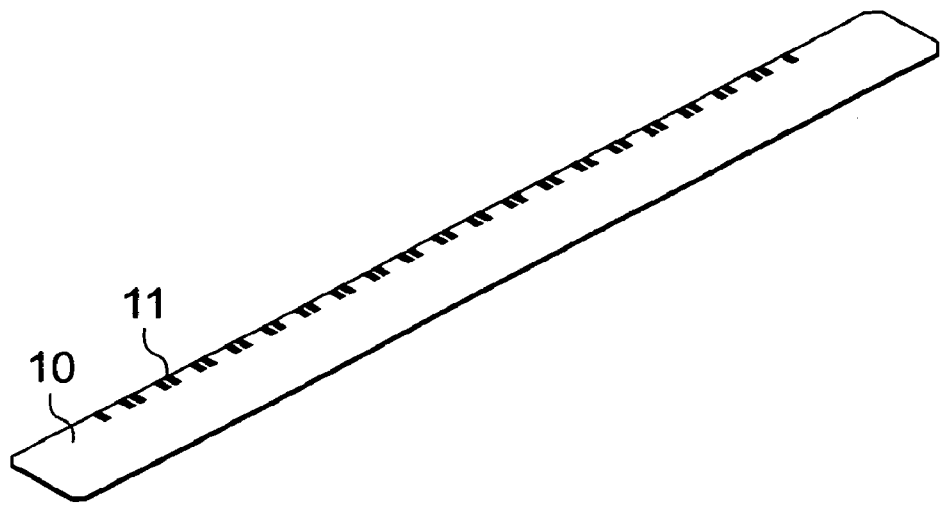
FIG. 8 is a schematic perspective view showing the entirety of the carriage pallet of the piezoelectric vibrator related to the first embodiment.
Figure 9:
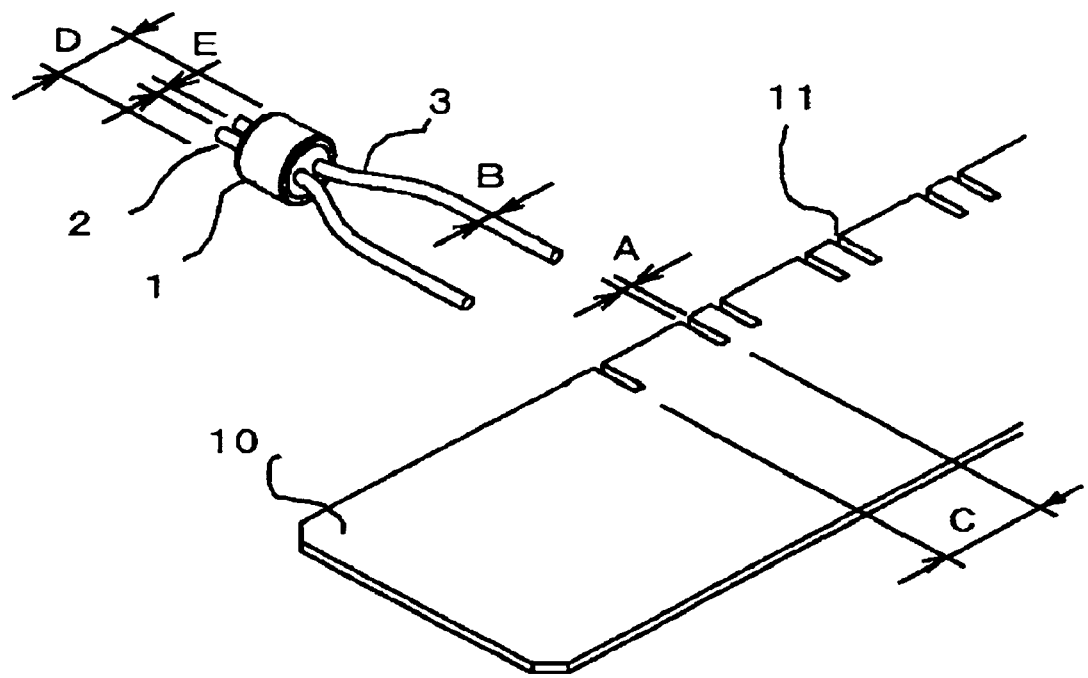
FIG. 9 is a partial enlarged perspective view for specifically describing the carriage pallet shown in FIG. 8.
Figure 10:
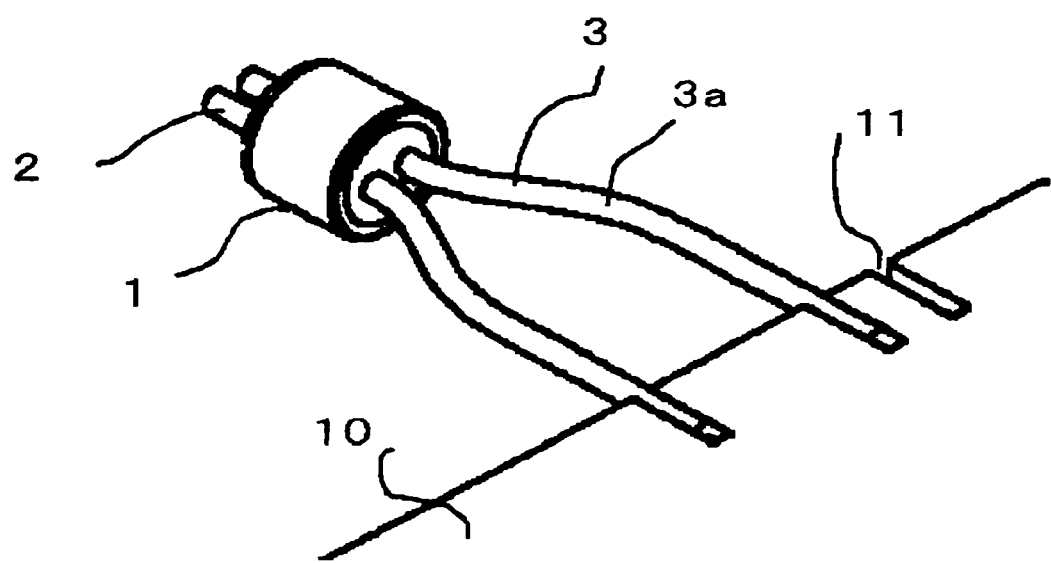
FIG. 10 is a partial enlarged perspective view showing the conservation state of the airtight terminal in the carriage pallet shown in FIG. 8.
Figure 11:
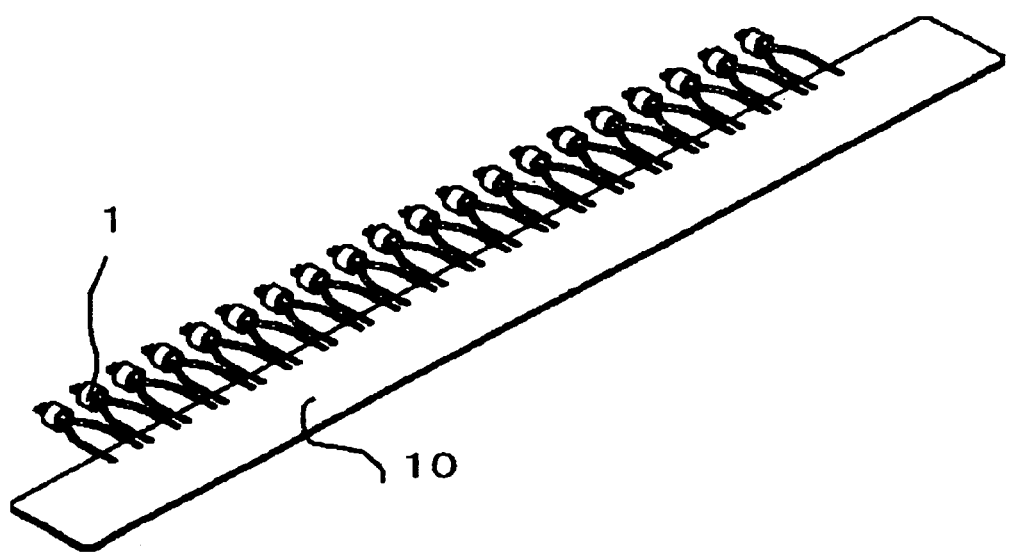
FIG. 11 is a schematic perspective view showing the entirety of the arrangement and conservation state of a plurality of airtight terminals in the carriage pallet shown in FIG. 8.

FIGS. 8 to 11 show schematic perspective views for describing an example of a carriage pallet for a piezoelectric vibrator, used for mounting airtight terminals, according to the embodiment. FIG. 8 is a schematic perspective view showing the entire carriage pallet. FIG. 9 is a partial enlarged perspective view for describing in detail the carriage pallet of FIG. 8. FIG. 10 is a partial enlarged perspective view showing the state of the airtight terminal held on a rectangular thin plate of the carriage pallet. FIG. 11 is a schematic perspective view showing the state of the entire airtight terminals held on the carriage pallet.

Figure 12:
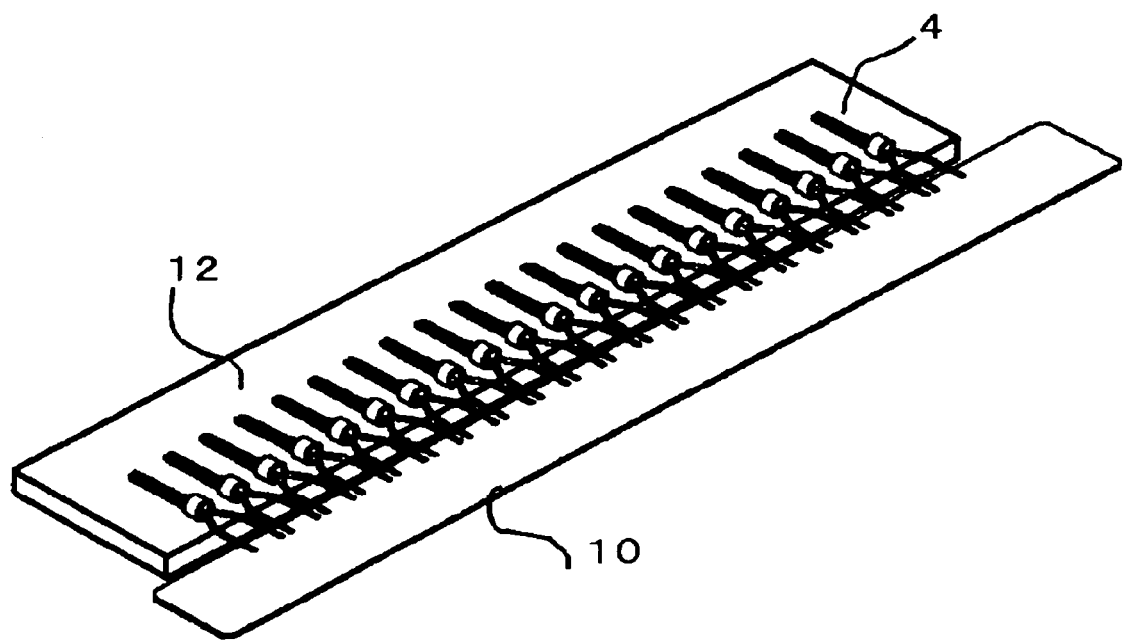
FIG. 12 is a schematic perspective view for showing the alignment of a piezoelectric vibrating piece arrangement jig and a carriage pallet.
Figure 13:
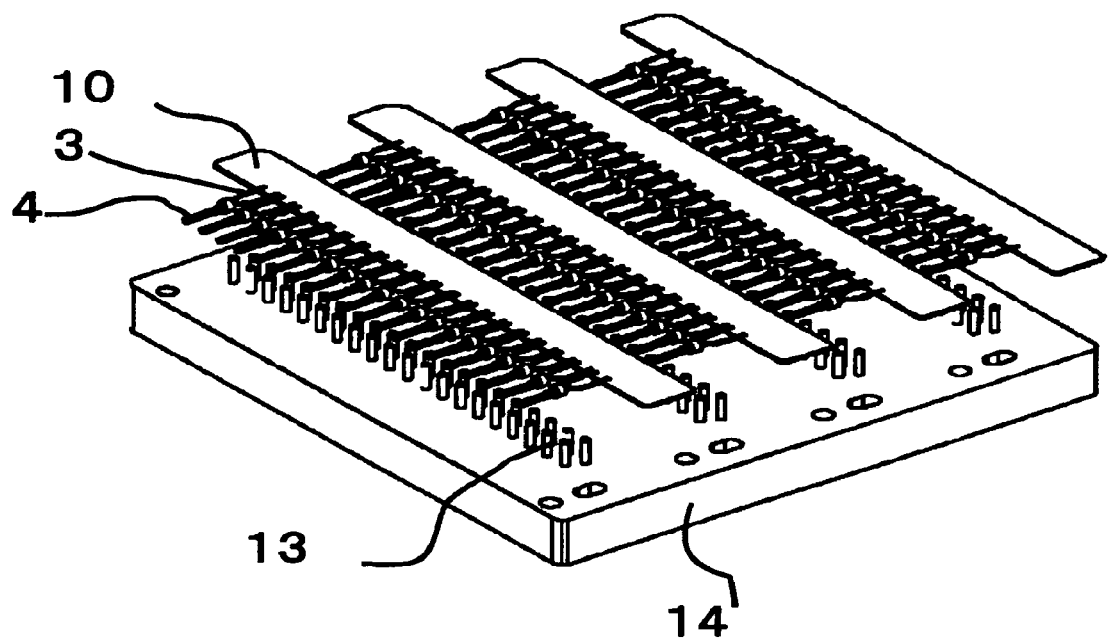
FIG. 13 is a schematic perspective view for showing the frequency trimming process related to the first embodiment.
Figure 14:
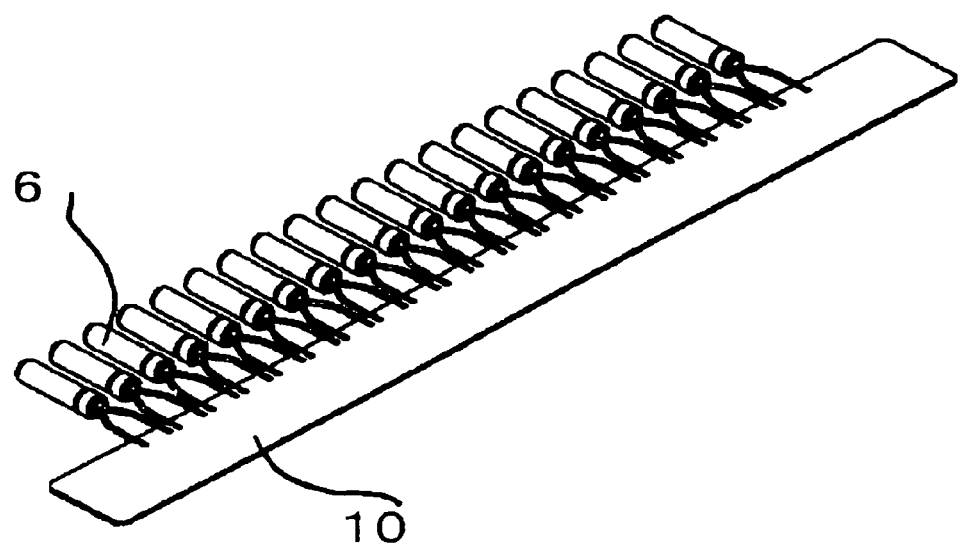
FIG. 14 is a schematic perspective view showing the entirety of the arrangement and conservation state of a plurality of piezoelectric vibrators in the carriage pallet shown in FIG. 8.

FIG. 12 is also a schematic perspective view for describing the alignment of a piezoelectric vibrating piece arrangement jig and a carriage pallet. FIG. 13 is a schematic perspective view of an implement for describing electrical measurement according to the embodiment. FIG. 14 is a schematic general perspective view of the entire group of piezoelectric vibrators held on the carriage pallet according to the invention.

In the piezoelectric vibrator manufacturing process, the carriage pallet for piezoelectric vibrators with outer leads 3 of airtight terminals 1 attached thereto is used as airtight terminal 1 alignment and carriage means.

As shown in FIG. 8, a carriage pallet 10 for piezoelectric vibrators according to the invention is shaped like a rectangular thin plate and has a plurality of cuts 11 along a long side thereof. As shown in FIG. 9, pairs of at least 2 cuts are arranged. The width A of the cut 11 is generally equal to the diameter B of an outer lead 3. The cut 11 interval C is larger than the outer diameter D of the airtight terminal 1.

A plurality of cuts 11 are formed along one side of the carriage pallet 10 using a general-purpose precision processing machine such as a dicing machine which provides a processing accuracy of a few μm, for example. Each pair of outer leads 3 are inserted into cuts for holding purposes, thereby making highly accurate the shape of the carriage pallet 10 required for the processes according to the invention, and the positions of a plurality of cuts 11 and outer leads 3.

As shown in FIG. 10, each outer lead 3 has a width slight smaller than the width of each of the plurality of cut 11 intervals and inserted into the cut and held by a method such as press-fitting or adhesion.

In the present embodiment, the shape accuracy of the carriage pallet 10, the width accuracy for the cut 11 and the accumulated pitch accuracy for cuts 11 are within 5 μm. The width A of the cut 11 shown in FIG. 9 is generally equal to the diameter B of the outer lead 3. The former width is 0.16 mm and the latter is 0.18 mm. The interval C for a pair of cuts 11 is 1.5 mm. The outer diameter D of the airtight terminal 1 is 1.1 mm. The gap E between inner leads 2 is 0.3 mm. The interval C for a pair of cuts 11 is larger than the outer diameter D of the airtight terminal 1 and 5 times as large as the 0.3 mm gap E between inner leads 2. This cause the accuracy of a turning angle for inner leads 2 to be controlled to ⅕ of a turning angle for outer leads 3.

This ensures that the positions of the outer leads 3 of the airtight terminal 1 and the inner leads 2 are very accurate in the carriage pallet 10. The accuracy is at a high level of accuracy provided by the precision processing machine.

The carriage pallet 10 is formed of ceramic material, which can maintain the positional accuracy of a plurality of cuts 11 and electrical isolation between the plurality of cuts 11, thus making inner leads 2 according to the embodiment electrically independent. The material is preferable for the measurement process for obtaining a predetermined frequency by applying drive voltage of a piezoelectric vibrating piece 4.

As shown in FIG. 11, the carriage pallet 10 can easily carry and move individual airtight terminals 1 attached thereto all together at one time. The simple shape of the rectangular thin plate can also facilitate the removal of the carriage pallet 10. The carriage pallet 10 is easy to position and easy to stabilize and suitable for the automation of the bonding process according to the embodiment. The carriage pallet 10 is also wear resistant enough to withstand repeated alignment work and transfer between manufacturing units. The carriage pallet 10 can be used during heating and in a vacuum. The carriage pallet 10 is also preferable for a plurality of processes in the manufacture of piezoelectric vibrators for carriage pallet 10 for piezoelectric vibrators.

As shown in FIG. 10, the outer lead 3 has the central portion 3a thereof directed outward. The outer lead 3 is formed to have the width 11 of the cut interval and inserted into a cut. A turning angle for the outer lead and a high positional accuracy of a plurality of grooves in the pallet allows the outer lead to be formed to have a required bend. This makes accurate the position of the central portion required for bonding.

As described above, inner leads 2 inside airtight terminals 1 are attached to the carriage pallet 10 shown in FIG. 5 for piezoelectric vibrators with high accuracy. As shown in FIG. 6, the carriage pallet 10 with inner leads 2 attached accurately thereto is aligned with an arrangement jig 12 with piezoelectric vibrating piece 4 arranged thereon. The inner lead 2 is brought into contact with the piezoelectric vibrating piece 4. After heating, the piezoelectric vibrating piece 4 is bonded to the inner lead 2.

Next, in the frequency trimming process for obtaining the above-mentioned predetermined frequency, the carriage pallet 10 for piezoelectric vibrators with outer leads 3 attached thereto is passed through a heated furnace. As shown in FIG. 13, the carriage pallet 10 is then laid on a measurement block 14 on which measurement terminals 13 is provided in a vacuum and the measurement blocks 14 are brought into contact with the piezoelectric vibrator outer leads 3. By applying drive voltage to the measurement terminals 13, drive voltage to flows on the surface of the vibrating pieces 4 via the outer lead 3 to repeatedly obtain the predetermined frequency for frequency trimming. A weight metal film provided in advance to the piezoelectric vibrating piece 4 is vaporized gradually to make the vibration of the piezoelectric vibrating piece 4 a predetermined frequency, whereby frequency adjustment can be done. A sealing tube 5 is inserted into each of the airtight terminals 1. As shown in FIG. 14, this provides completed piezoelectric vibrators 6 attached to the carriage pallet 10 in the piezoelectric vibrator preparation process.

[Lead Frame Preparation Process]

Figure 15:
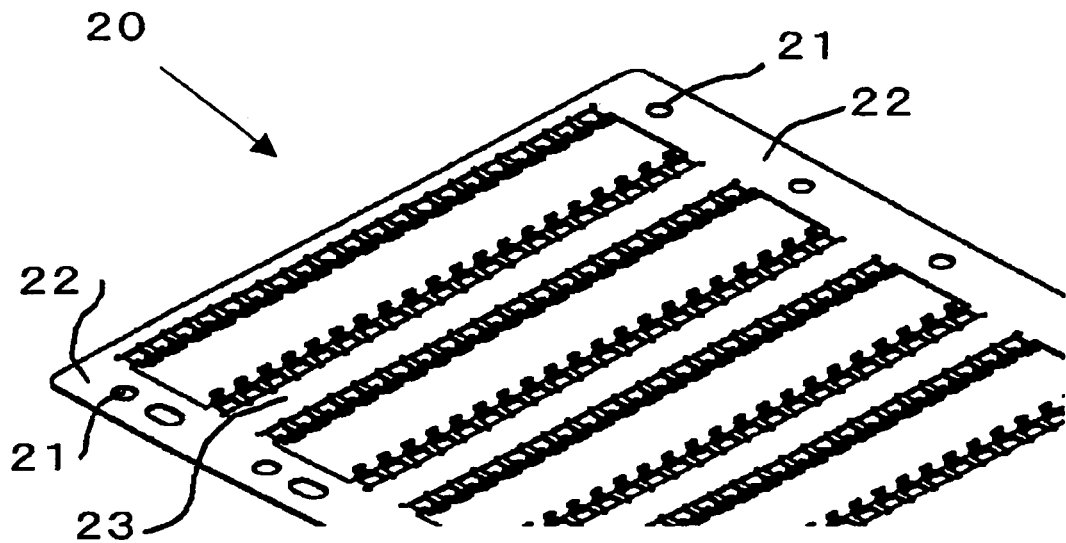
FIG. 15 is a schematic perspective view showing a lead frame for the surface mount type-piezoelectric vibrator related to the first embodiment.
Figure 16:
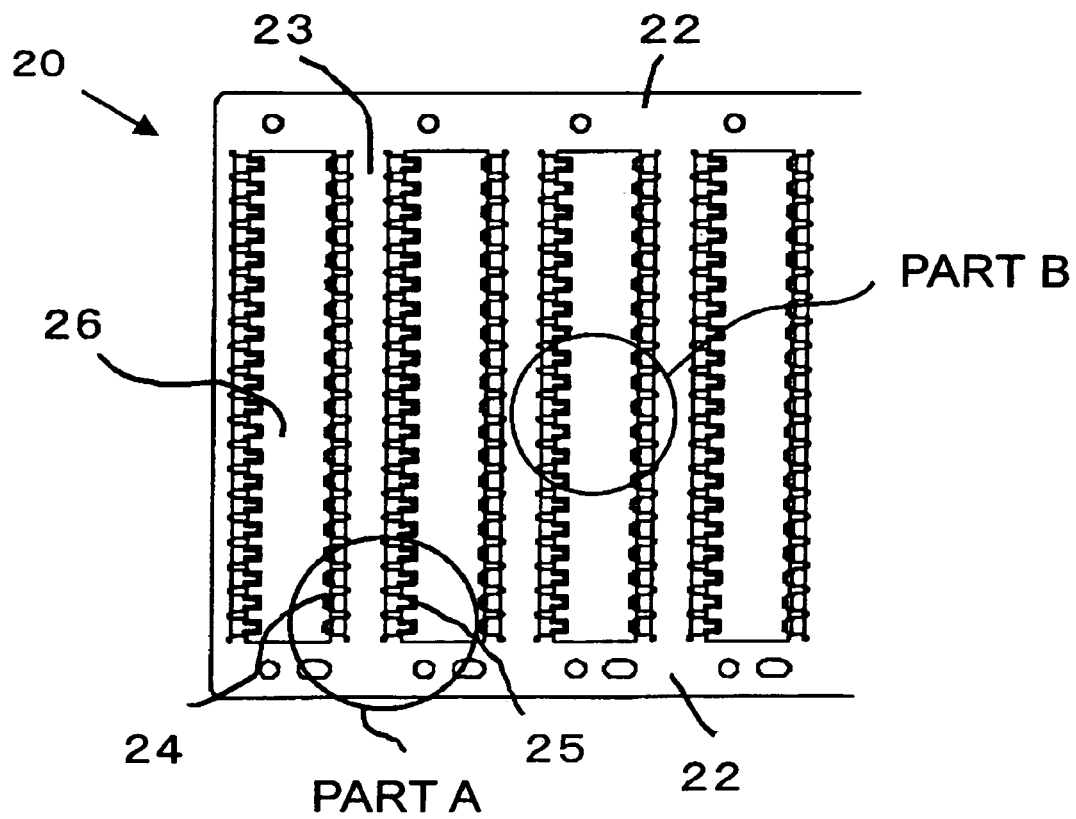
FIG. 16 is a schematic plan view for showing the lead frame shown in FIG. 15.
Figure 17:
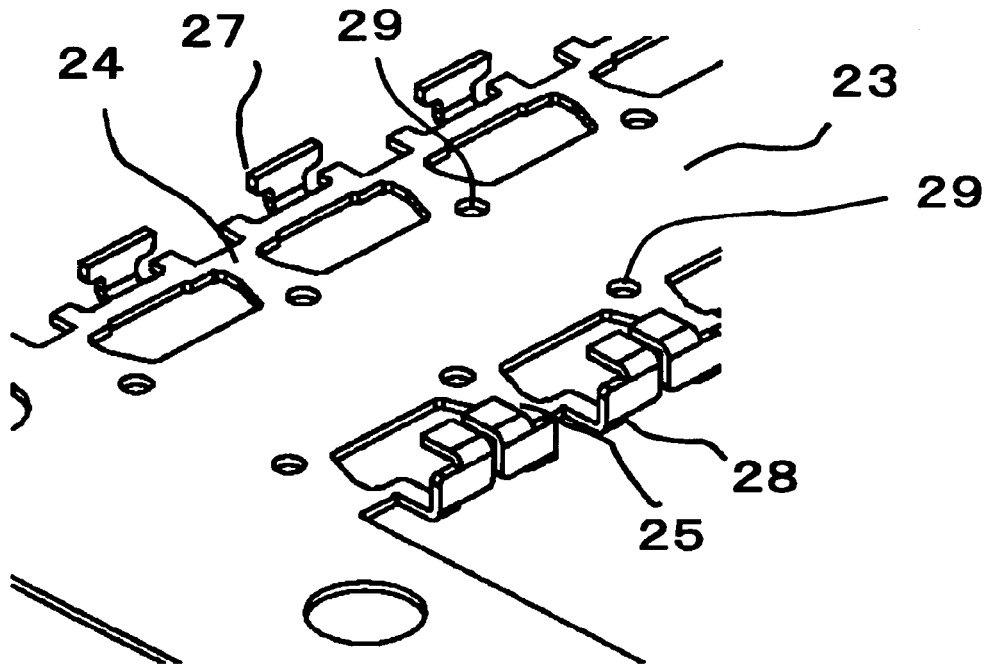
FIG. 17 is an enlarged perspective view of section A of the lead frame shown in FIG. 16.
Figure 18:
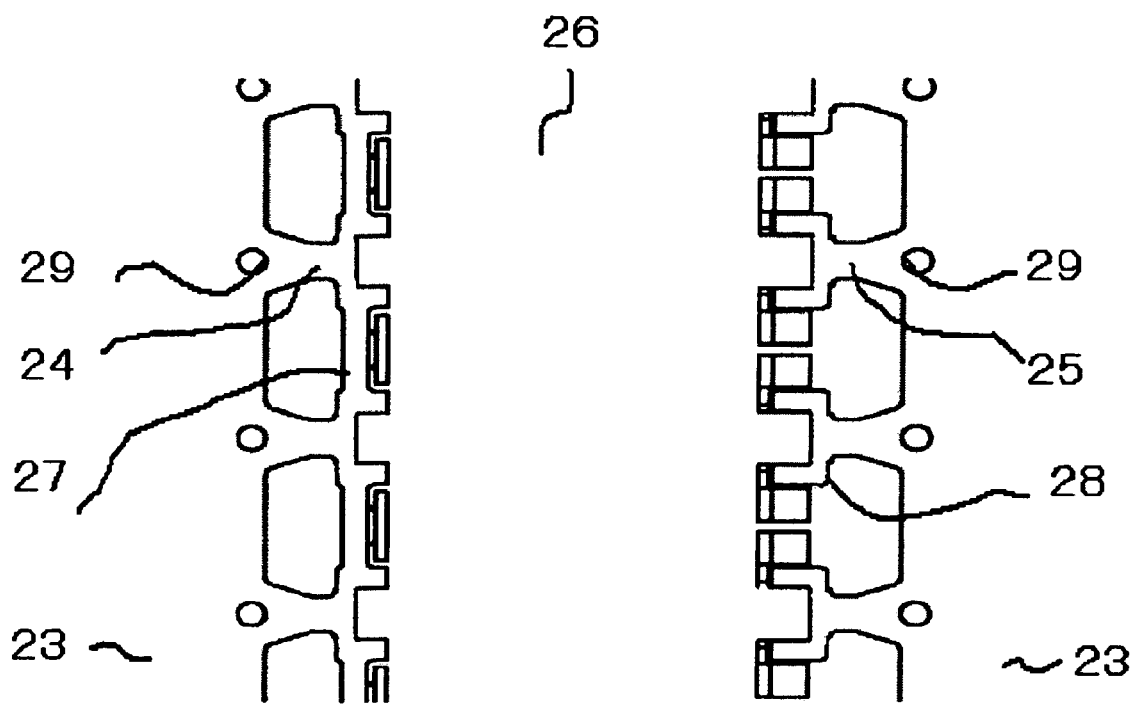
FIG. 18 is an enlarged plan view of section B of the lead frame shown in FIG. 16.
Figure 19:
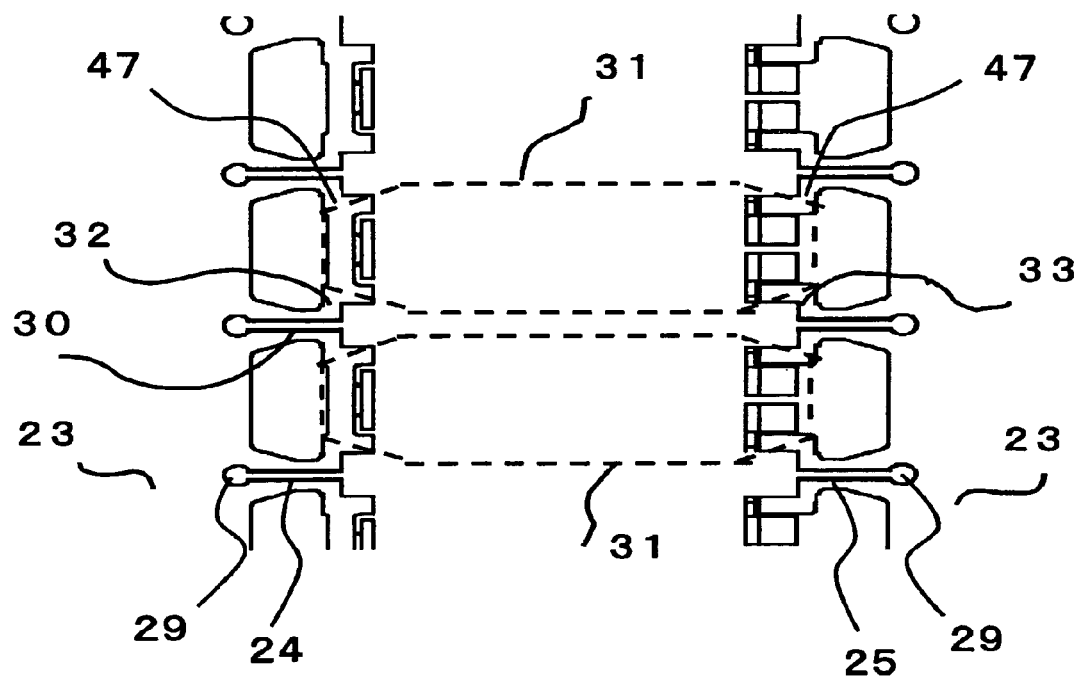
FIG. 19 is a plan view showing the state of slit processing of the lead frame shown in FIG. 18.
Figure 20:
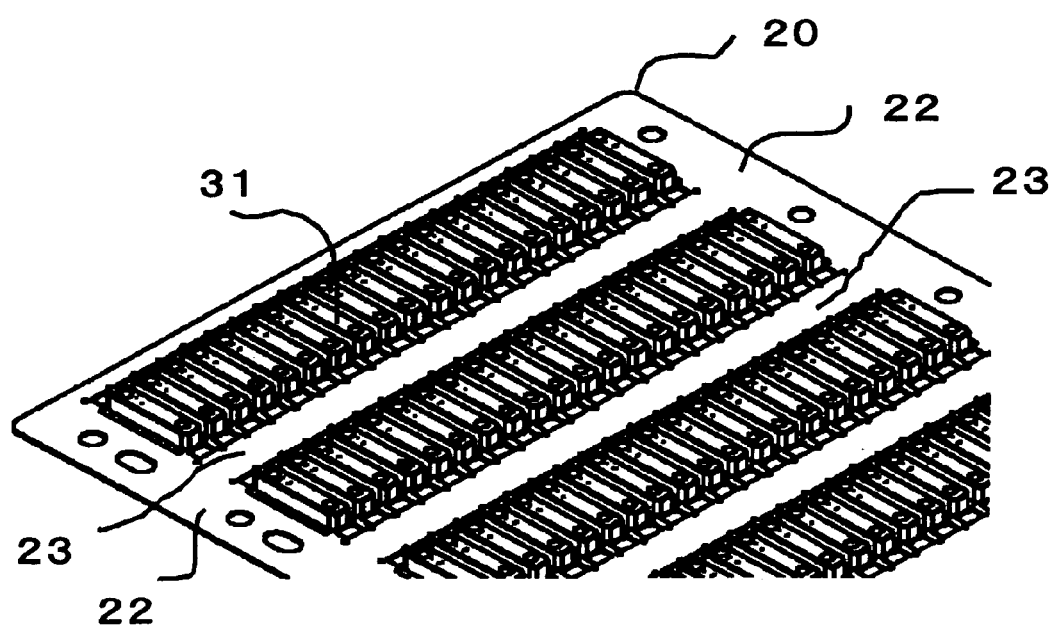
FIG. 20 is a schematic perspective view showing the state that the piezoelectric vibrator is resin-molded on the lead frame through the plural arrangement in relation to the first embodiment.
Figure 21:
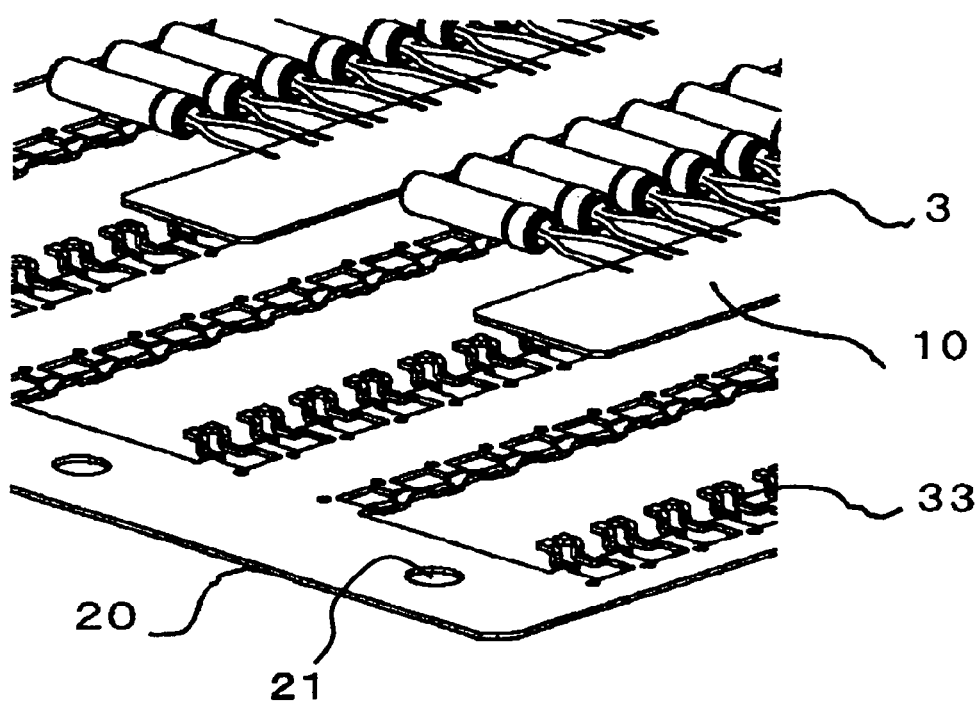
FIG. 21 is a schematic perspective view for describing the process for bonding an outer lead with an electrode terminal formed in the lead frame in relation to the first embodiment.
Figure 22:
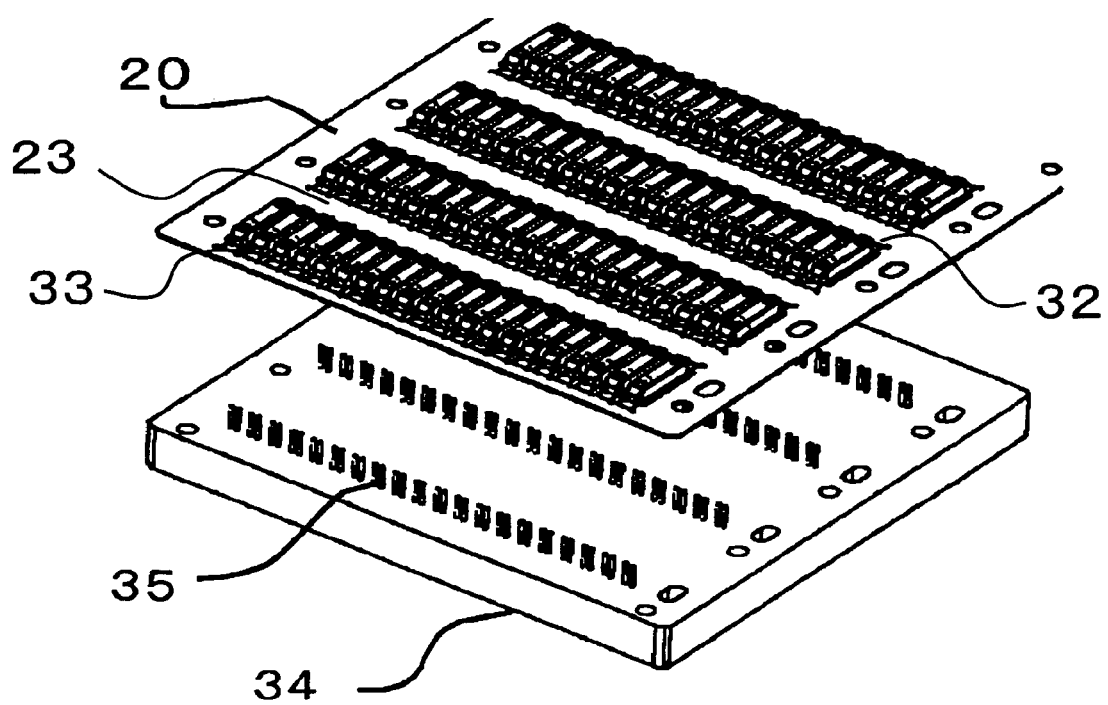
FIG. 22 is a schematic perspective view for describing the electrical testing process in relation to the first embodiment.

Next, the lead frame preparation process will be described with reference to FIGS. 15 to 22. FIGS. 15 to 19 show the lead frame related to the embodiment and FIG. 15 is a schematic perspective view, FIG. 16 is a schematic plan view, FIG. 17 is a partial enlarged perspective view of section A shown in FIG. 16, FIG. 18 is a partial enlarged plan view of section B shown in FIG. 16, and FIG. 19 is a plan view showing the state of slit processing as a post-process. Further, FIG. 20 is a schematic perspective view showing the state that the piezoelectric vibrator of the embodiment is resin-molded on the lead frame, FIG. 21 is a schematic perspective view for describing the process for bonding an outer lead and an electrode terminal formed in the outer lead, and FIG. 22 is a schematic perspective view for describing the electrical testing process of the embodiment.

The lead frame plays an important role in the bonding process of the after-mentioned outer lead and electrode terminal, resin mold process, electrode terminal cutting process, and electrical testing process. The preparation process of the lead frame will be described in detail.

As shown in FIG. 15, the lead frame 20 for the surface mount type piezoelectric vibrator of the embodiment has a pair of side frames 22 including one or more positioning holes 21, section bar 23 bridging the pair of side frames 22, a first lead section 24 and a second lead section 25 shown in FIG. 16.

The lead frame 20 according to the embodiment is formed by forming a side frame 22, first and second lead sections 24, 25 of a flat material 0.15 mm in thickness, for example, through press work and performing predetermined bending work on each of these components. The flat material is made of conductive material such as iron-containing alloy such as 42-alloy.

In the frame area 26 partitioned by the side frame 22 and section bar 23, only the first and second lead sections 24, 25 are disposed as shown in FIG. 16, with no frames for individual lead sections. The frame area 26 serves as an area occupying a large area and it is possible to make the most of the space inside the frame area 26.

In the frame area 26, as shown in FIG. 17 which is an enlarged view of section A of FIG. 16 and FIG. 18 which is an enlarged view of section B, there are arranged a plurality of second lead section 25 are arranged at the same intervals as the plurality of first lead sections 24 and the second lead section 25 which faces the first lead section 24 and extends from the section bar 23. The lead section 24 and lead section 25 are arranged in the widthwise direction of the lead frame 20 to the longitudinal direction of the lead frame 20 and maintained by the section bar 23, whereby the lead frame 20 of a minimum configuration is formed without a waste frame.

The tip of the first lead section 24 connects to adjacent lead sections to form a first protruding section 27 at the central section. The second lead section 25 has a tip divided into two sections to form a second protruding section 28. The first protruding section 27 has a vertical section formed, which section will be made to a dummy terminal 32 for a surface mount type piezoelectric vibrator 31 in the subsequent manufacturing processes. The second protruding section 28 at the tip of the second lead section 25, divided into two sections, is bent like a u-shape having a vertical section and a horizontal section. The second protruding section 28 undergoes subsequent manufacturing processes and serves as an electrode terminal 33 for a surface mount type piezoelectric vibrator 31.

As shown in FIG. 18, first lead section 24 faces the second lead section 25 in the longitudinal direction of the lead frame 20 with frame area 26 between these lead sections. A plurality of through holes 29 are formed to correspond to each of the first lead section 24 and second lead section 25 on a center line connecting the centers of the first lead section 24 and the second lead section 25. The through hole 29 is provided in the longitudinal direction of the lead frame 20. The through hole 29 is also provided where section bar 23 intersects with the first lead section 24 and where the section bar 23 intersects with the second lead section 25.

The plurality of through holes 29 are provided as described above in advance because a slit having a width at least smaller the diameter of the through hole 29 is cut with the hole 29 as the end point in the subsequent electrode terminal portion cutting process.

If a slit with a closed end is cut, a cutting tool on the closed end is subjected to a local load, which affects the service life of the cutting tool and makes a continued slit cutting work difficult. Therefore, a through hole 29 is provided if a slit is cut between the central portion of the tip of the first lead section 24 in the lead frame 20. This makes it possible to continue cutting the slit with no local load on the cutting tool. The slit cutting work will be again described later when describing the subsequent electrode terminal portion cutting process.

As a result, a surface mount type piezoelectric vibrator 31 characteristically has a width that is ⅓ to ⅕ smaller than the length thereof. As shown in FIG. 20, surface mount type piezoelectric vibrators 31 are directed in the longitudinal direction of the lead frame 20 and arranged across the width of the lead frame 20. Therefore, surface mount type piezoelectric vibrators 31 can be disposed with high density in a matrix on the lead frame 20.

In the process for bonding an electrode terminal 33 to an outer lead 3 on the lead frame 20 for a surface mount type piezoelectric vibrator according to the embodiment, outer leads 3 are arranged in the same position as electrode terminals 33 on the lead frame 20, as shown in FIG. 21 and as will be described later. Therefore, a plurality of outer leads 3 are simultaneously aligned with high density through a single alignment of a carriage pallet 10 as a carriage pallet. The outer leads 3 are laid on the bonding electrode terminals 33 and transferred for bonding purposes. Therefore, outer leads 3 can be simultaneously bonded to electrode terminals 33 with high accuracy and in a stable manner on the lead frame 20.

In the resin molding process for the lead frame 20 for surface mount type piezoelectric vibrators according to the embodiment, cavities are connected to one another through a flat surface, as shown in FIG. 20 and as will be described later. Therefore, adjacent cavities are directed in the longitudinal direction of the side frame 22 and first and second lead sections 24, 25 are directed in the direction of the side frame 22. Surface mount type piezoelectric vibrators are thus arranged with good space efficiency. One runner is disposed on the section bar 23 and includes injection molding ports provided toward between the first lead section and the second lead section. Thus, a line having a minimum length is provided per cavity and cavities ad provided with a maximum density on the section bar 23 having a minimum configuration with no wasteful frames. Molds having a construction that provides a maximum resin use rate are also provided on the lead frame 20.

The longitudinal directions of the first and second lead sections 24, 25 and cavities are in the direction of the side frame 22 and piezoelectric vibrators are arranged in the direction of the section bar 23. This permits mold center misalignment to appear in the misalignment-insensitive longitudinal direction of the surface mount type piezoelectric vibrator, while mold center misalignment conventionally appears in the longitudinal direction of the side frame 22. Therefore, a resin mold construction can be provided that can eliminate resin chipping due to the center misalignment for the surface mount type piezoelectric vibrator in the process for cutting the first and second lead sections on the lead frame 20.

The lead frame 20 for surface mount type piezoelectric vibrators according to the embodiment suffers from no warpage across the lead frame 20 through a slit 30 provided with a through hole 29 as an end point in the electrode terminal 33 portion cutting process, which will be described later. This is because the expansion of a surface with a slit cut therein is absorbed the slit 30.

In the electrical test process for the lead frame 20 for surface mount type piezoelectric vibrators according to the embodiment, as will be described later with reference to FIG. 22, each of the surface mount type piezoelectric vibrator has two-directional terminals: one terminal functions as an electrode terminal 33 and the other is an electrically completely independent dummy terminal 32. The surface mount type piezoelectric vibrators can be arranged on the section bar 23 having a minimum configuration with no wasteful frame, in a matrix with high density over the entire lead frame 20. The largest possible number of electrical contact terminals 35 on an electrical test measurement block are brought into contact with the piezoelectric vibrators on the lead frame 20.

As described above, by the method described above, the lead frame 20 for surface mount type piezoelectric vibrators makes it possible to meet a positional accuracy required for alignment in the process for bonding an outer lead 3 to an electrode terminal 33, eliminate resin chipping in the resin molding process, maintain mold accuracy with a higher cavity density without complicating resin molding molds, eliminate lead frame deformation in the cutting process and measure surface mount type piezoelectric vibrators on the lead frame in an electrical test in the electrical test process.

[Process for Bonding an Outer Lead to an Electrode Terminal]

Next, the process for bonding an outer lead to an electrode terminal is described with reference to FIG. 21 and FIGS. 23 to 25.

FIG. 21 is a schematic perspective view entirely showing the process for bonding the outer lead to the electrode terminal as described above. The electrode terminal 33 of the lead frame 20 shown in FIG. 21 is crank-shaped. This reason is that in the process for bonding the outer lead to the electrode terminal entire, the method for positioning the electrode terminal 33 to the outer lead 3 can be applied to both u-shaped electrode terminal and crank-shaped electrode terminal according to the invention. That is, instead of the lead frame 20 shown in FIG. 21, the lead frame 20 shown in FIG. 17 is available.

Figure 23A:
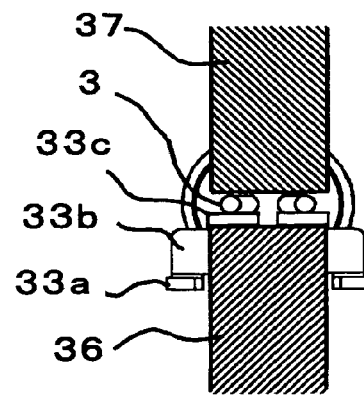
FIGS. 23A and 23B show the process for bonding the outer lead to the electrode terminal formed the lead frame related to the first embodiment.
Figure 23B:
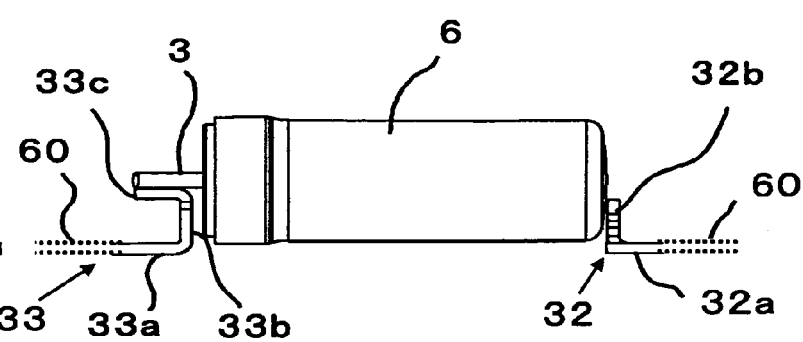
Figure 24:
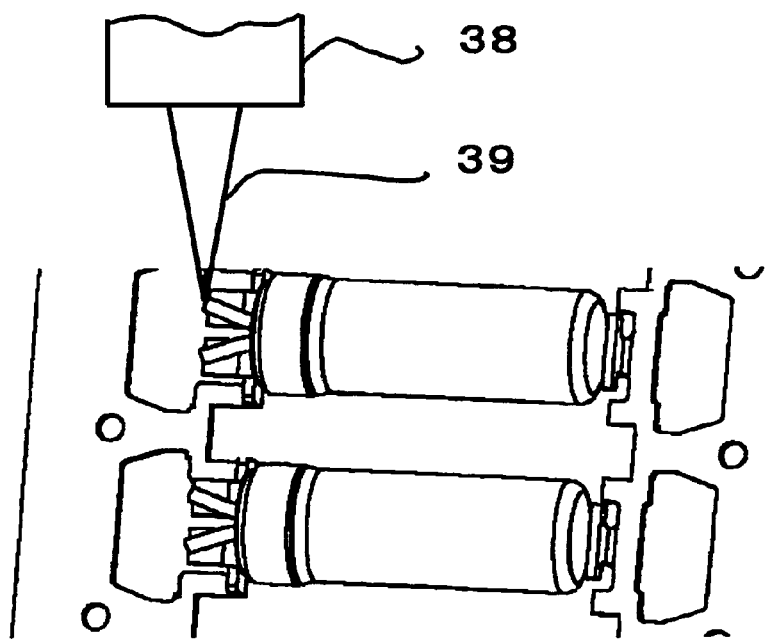
FIG. 24 is a schematic perspective view showing the method for separating the piezoelectric vibrator from the pallet.
Figure 25:
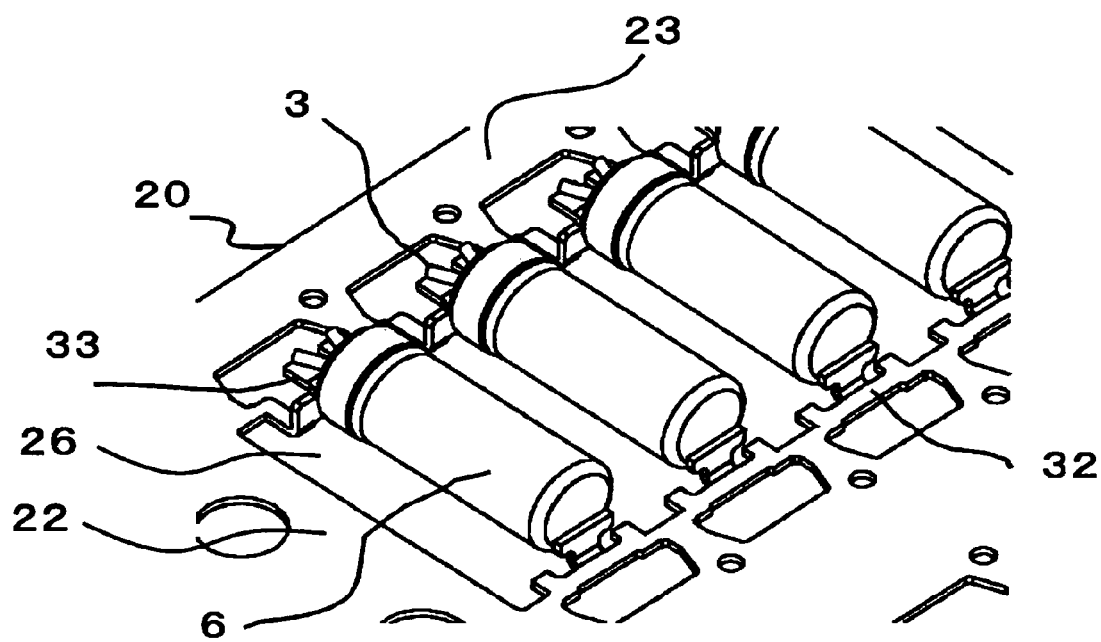
FIG. 25 is a schematic perspective view for showing the termination state of the bonding process of the outer lead and electrode terminal related to the first embodiment.

FIGS. 23A and 23B show the method for bonding the outer lead to the electrode terminal formed the lead frame and FIG. 23A shows the method for applying the bonding voltage as shown in FIG. 6 and FIG. 23B is a right side view of the piezoelectric vibrator of FIG. 23A. FIG. 24 is a schematic perspective view showing the method for separating the piezoelectric vibrator from the pallet. FIG. 25 is a schematic perspective view for showing the termination state of the bonding process of the embodiment.

As described in the lead frame preparation process, when the configuration of the lead frame 20 is summarized, a plurality of first lead sections 24 and a plurality of second lead sections 25 are provided in the frame area 26 shown in FIG. 18. The first lead sections 24 extend from the section bar 23 at appropriate intervals. The second lead sections 25 faces first lead sections and extend at same intervals. The first lead section 24 has adjacent lead sections connected to form a first protruding portion 27 at the central portion. The second lead section 25 has a tip divided into two portions to form a second protruding portion 28. The first protruding portion 27 has a vertical portion formed, which portion serves as a dummy terminal 32 for a surface mount type piezoelectric vibrator 31 after slit 30 cutting, as shown in FIG. 19 and as will be described later. The second protruding portion 28 at the tip of the second lead section 25, divided into two portions, is bent like a crank having a vertical portion and a horizontal portion. The second protruding portion 28 under goes subsequent manufacturing processes and serves as an electrode terminal 33 for a surface mount type piezoelectric vibrator 31. The section bar 23 has a margin in width relative to the rectangular thin plate used as a carriage pallet 10 and as an application for disposing a runner used in resin molding. As compared with a conventional lead frame, the lead frame 20 has relatively a high strength and a high rigidity until a slit described later is cut. The shape and positional accuracy for the dummy terminal 32 and the electrode terminal 33 is maintained.

As shown in FIGS. 23A and 23B, the dummy terminal 32 has a horizontally extending section 32a and a section 32b vertically extending from the horizontally extending section 32a. The electrode terminal 33 facing the dummy terminal 32 has a section 33a horizontally extending from the section bar 23 of the lead frame 20, a section 33b vertically extending from the horizontally extending section 33a and a section 33c horizontally extending from the upper side of the vertically extending section 33b. The horizontally extending section 32a of the dummy terminal 32 includes a holding section for mechanical bonding with the mounting substrate after molding resin. In addition, the horizontally extending section 33a of the electrode terminal 33 includes the lower electrode terminal 33a for electrically contacting the mounting substrate with the external electrode after molding resin.

In the bonding process, piezoelectric vibrators 6 are disposed in a frame area 26, which is a space for surface mount type piezoelectric vibrator 31 arrangement on a lead frame 20. The piezoelectric vibrators 6 are properly aligned and outer leads 3 are placed on the upper terminals 33c on the lead frame 20. The outer leads 3 and the upper electrode terminals 33c are then received by lower bonding electrodes 36. The outer lead 3 and the upper electrode terminal 33c are held between the upper electrode 37 and the lower electrode 36 and voltage is applied for bonding purposes.

First, the lead frame 20 is described with reference to FIG. 21 return. As shown in FIG. 21, a plurality of positioning holes 21 are provided at constant intervals on a side frame 22 on a lead frame 20. Lead frame 20 positioning pins (not shown) are provided to rise at constant intervals on a lead frame 20 positioning jig. The pins correspond to a plurality of positioning holes 21 on the lead frame 20. The lead frame 20 is aligned with the side frame 22 by inserting the positioning pins into the plurality of positioning holes 21 in the lead frame 20.

Piezoelectric vibrators 6 are then disposed in a frame area 26 for surface mount type piezoelectric vibrator 31 arrangement on the lead frame 20.

For understanding, in a method for moving conventional piezoelectric vibrators 6 individually, it is difficult to align a turning angle for the outer lead 3, a bonding point 3a for electrical continuity with an outer lead 3 and the position of a cutting end for the outer lead 3. Therefore, the correct alignment of the three points is required.

In other words, conventionally there is an inconvenience where three alignments cannot made properly and bonding cannot be performed. These three alignments include a turning angle difference for a pair of two outer leads 3 relative to a pair of two upper electrode terminals 33c, an alignment of required bonding points 3a between the central portion of the upper electrode terminal 33c, the bonding point of the upper electrode terminal 33c, and the bent outer lead 3 and a alignment of the end of the outer lead 3 between the upper electrode terminal 33c and the contour of the piezoelectric vibrator 6.

In the embodiment, the outer lead 3 is aligned with the lead frame 20 by a method for using a carriage pallet 10 that ensures the turning angle for the outer lead 3 for the piezoelectric vibrator 6 and positional accuracy as alignment means.

As shown in FIG. 21, an alignment reference for the carriage pallet 10 is provided on a lead frame 20 positioning jig to settle the positions of the carriage pallet 10 and the lead frame 20. The alignment reference for the carriage pallet 10 is the same as positioning pins (not shown) on the lead frame 20. The reference on the carriage pallet 10 is aligned with the same reference on the lead frame 20 by bringing the carriage pallet 10 into contact with the positioning reference on the carriage pallet 10.

The carriage pallet 10 with outer leads 3 inserted therein to for holding purposes meets the shape accuracy and positioning accuracy of the carriage pallet 10 required for proper alignment, as described in the aforementioned piezoelectric vibrator preparation process. In other words, 1. The shape accuracy of the carriage pallet 10 is the same as a level of accuracy obtained by the precision processing machine described earlier, thus ensuring the positional accuracy of the outer lead 3 for the airtight terminal 1.

2. The gap E of the inner leads 2 protruding from the airtight terminal 1 shown in FIG. 9 is smaller than the outer diameter D of the airtight terminal 1 for the piezoelectric vibrator 6. As compared with this, the cut 11 interval C disposed to hold the outer lead 3 is larger than the outer diameter D of the airtight terminal 1 as described earlier. Therefore, the turning angle for the outer lead 3 and the position of the central bonding point 3a are regulated.

3. The lead frame 20 brought into contact with the outer leads 3 has a higher rigidity against deformation and is highly accurate. The alignment accuracy is therefore obtained by inserting positioning guide pins and the like into a plurality of positioning holes 21 to position the lead frame 20. In the process for bonding an outer lead 3 to an electrode terminal 33, the requirements for stable bonding between the outer lead 3 and the electrode terminal 33 are met.

4. In addition, dummy terminals 32 and electrode terminals 33 are arranged in the same direction as piezoelectric vibrators 6. It is therefore easy to align the carriage pallet 10 with the lead frame 20 and the carriage pallet 10 is preferable for machine processing using a transfer tool and the like.

As described above, the carriage pallet 10 can be utilized for three alignments including the turning angle for the outer lead 3, the central point 3a of the outer lead 3 such as a bonding point for electrical continuity with outer lead 3, and the end cutting terminal point for the outer lead 3.

Means for properly aligning the outer lead 3 and the piezoelectric vibrator 6 with the lead frame 20 can be taken without requiring means by a conventional method for using a radiused surface corresponding to the cylindrical side of the piezoelectric vibrator. In addition, the terminal of the outer lead 3 can be handled with required positional accuracy, which helps to reduce the longitudinal direction of the surface mount type piezoelectric vibrator 31.

Electrode terminal 33 are arranged on the lead frame 20 in the same manner as outer leads 3 for piezoelectric vibrators 6 are arranged on the carriage pallet 10, as shown in FIG. 21. Therefore, the stable positional accuracy guaranteed by the lead frame 20 and the carriage pallet 10 can be transferred as it is and bonding preparation is made with accuracy and stable posture ensured.

Under the above condition, a lower bonding electrode 36 is brought into contact with the bottom of an upper electrode terminal 33c for forming electrical continuity with an outer lead 3 outside a piezoelectric vibrator 6, as shown in FIG. 23. The outer lead 3 is bonded to the upper electrode terminal 33c by pressing a portion between an upper bonding electrode 37 and the lower bonding electrode 36 from above the outer lead 3 and applying voltage to the both of the upper bonding electrode 37 and the lower bonding electrode 36.

As shown in FIG. 24, after the bonding of the outer lead 3 and the electrode terminal 33, a portion between the bonding position of the outer lead 3 and the carriage pallet 10 is irradiate with laser beam 39 using a laser unit 38 for cutting purposes to separate the piezoelectric vibrator 6 from the carriage pallet 10, which has been incorporated into the carriage pallet 10 through the bonding of the lead frame 20 and the carriage pallet 10.

The outer lead 3 for the piezoelectric vibrator 6 is properly aligned with and bonded to the lead frame 20. The cutting position of the outer lead 3 with the lead frame 20 as a reference is then irradiated with laser beam 39 for cutting purposes. As shown in FIG. 25, the piezoelectric vibrator 6 is separated from the carriage pallet 10. The cutting position of the outer lead 3 suffers from no deviation in the longitudinal directional dimension of the piezoelectric vibrator 6 or no deviation in cutting accuracy for the outer lead 3 including the deviation and the terminal of the outer lead 3 is handled with required positional accuracy.

The ability to properly align the piezoelectric vibrator 6 with lead frame 20 also allows sure electrical connection and the proper formation of a resin-molded section around the piezoelectric vibrator 6.

As described above, by the method described above, the turning angle for a pair of two outer leads 3 relative to the upper electrode terminal 33c is regulated by a plurality of cuts 11 in the rectangular thin plate. A required positional accuracy for the outer lead 3 is met and the turning angle for the outer lead 3 and the plurality of cuts 11 in the rectangular thin plate are obtained with high positional accuracy. The outer lead 3 can therefore be bent into a required shape and with the alignment of required bonding points. Electrode terminals 33 are arranged on the lead frame 20 in the same manner as outer leads 3 are arranged on the rectangular thin plate. This allows a positional accuracy to be ensured, which is guaranteed by the lead frame 20 and the rectangular thin plate and stable, thus providing stable bonding. The piezoelectric vibrator 6 can be separate from the carriage pallet 10 by irradiating the piezoelectric vibrator 6 with laser beam 39 for cutting with the lead frame 20 as a reference. Therefore, the terminal of the outer lead 3 can be handed with required positional accuracy.

[Resin Mold Process]

Next, the process for resin-molding the periphery of a plurality of piezoelectric vibrators 6 held within the frame area 26 on the lead frame 20 will be described. The resin mold process indicates covering the periphery of the piezoelectric vibrator 6 with resin by injecting the resin molding material into a die while closing the lead frame with the die so that the lead frame is put between the upper side and lower side by using the resin mold die sectioned by the upper side and lower side on the above-mentioned die, a plurality of cavities corresponding to respective piezoelectric vibrator 6 are formed, whereby one-time injection of resin molding material enables mass-manufacturing the resin mold products of the piezoelectric vibrator 6 in a narrow space. That is, when the plurality of piezoelectric vibratos 6 are arranged in a matrix in high density, the production quantity per unit area of the surface mount type piezoelectric vibrator 31 remarkably increases.

Figure 26:
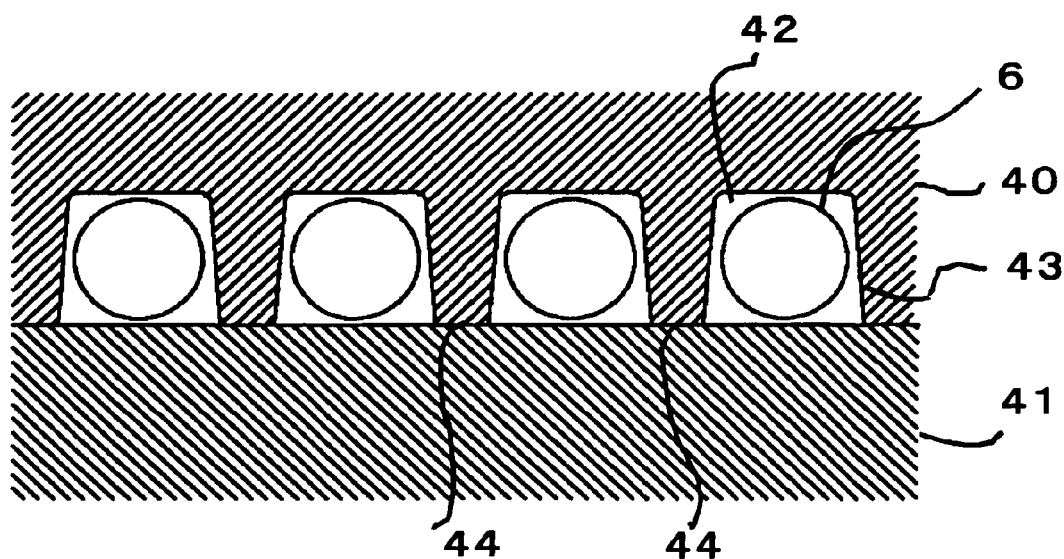
FIG. 26 is a schematic cross-sectional view showing the resin mold construction of the surface mount type piezoelectric vibrator related to the first embodiment.
Figure 27:
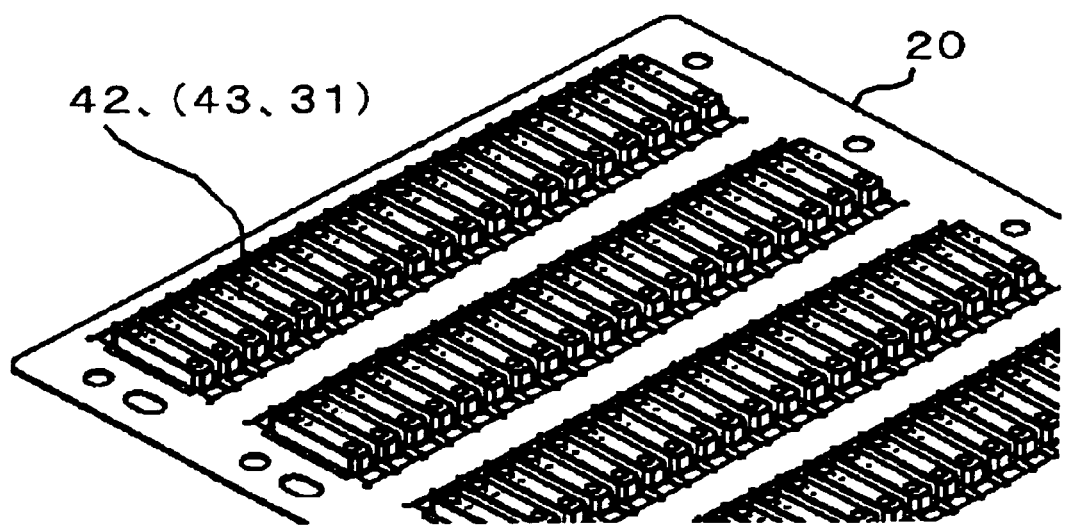
FIG. 27 is a schematic perspective view showing the plural arrangement state of the surface mount type piezoelectric vibrator related to the first embodiment on the lead frame.
Figure 28:
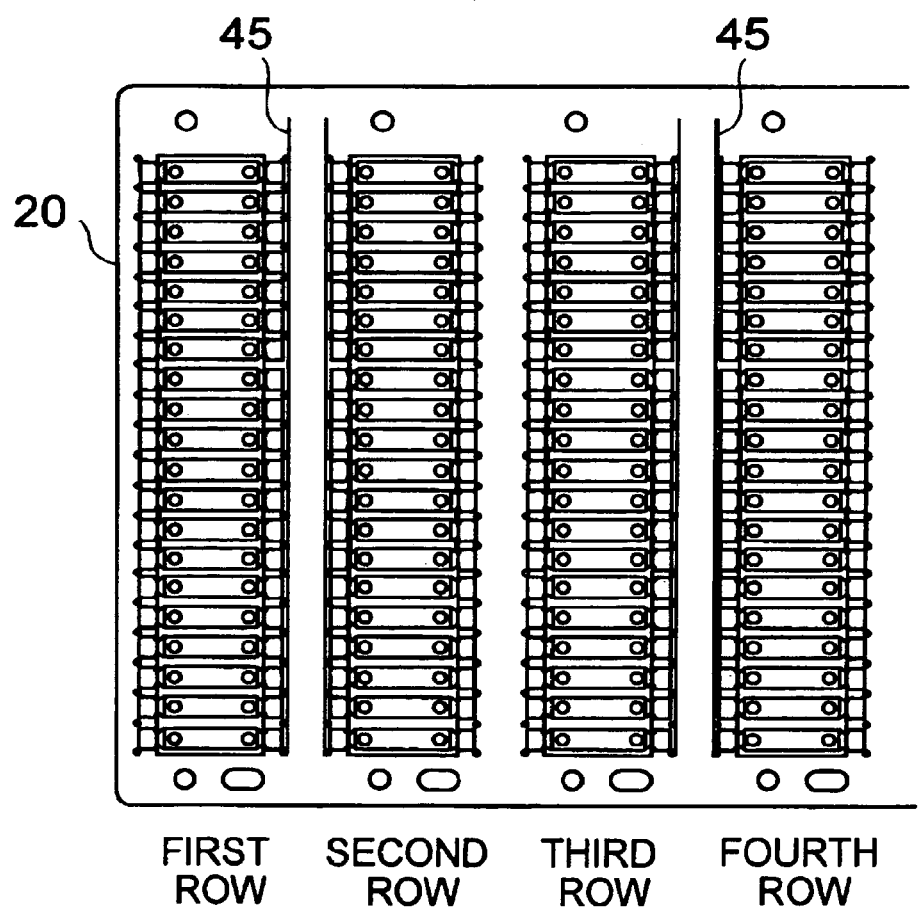
FIG. 28 is a schematic plan view for showing the resin mold construction related to the embodiment.
Figure 29:
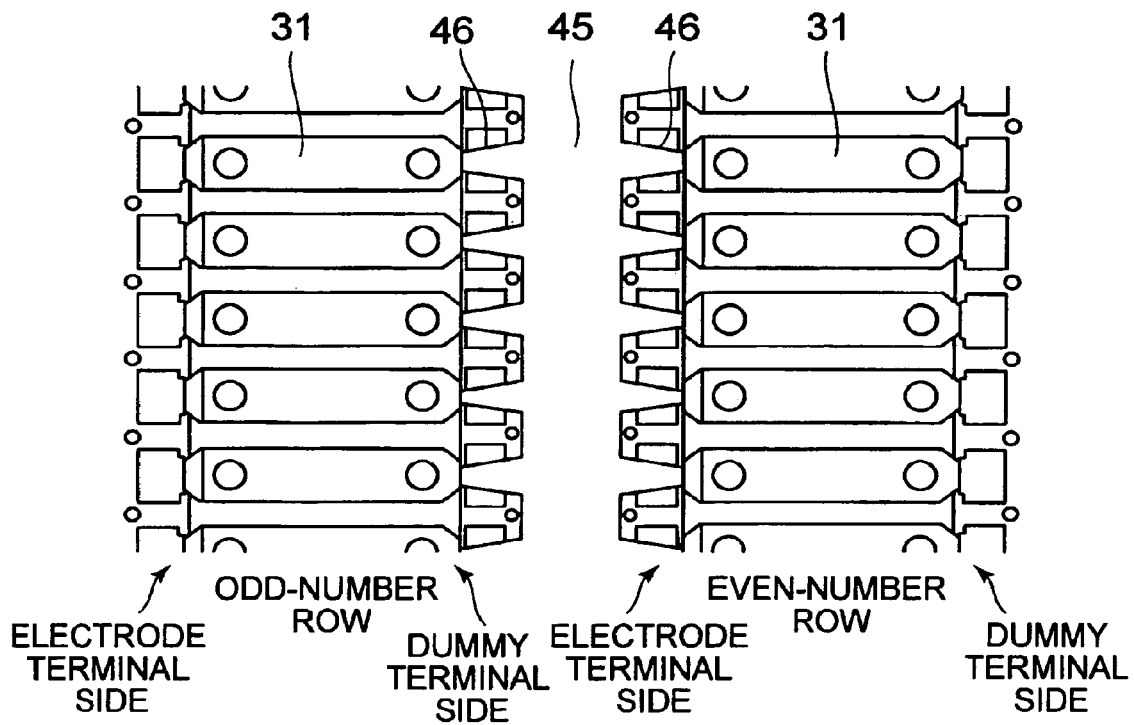
FIG. 29 is a partial enlarged view of the resin mold structure of the surface mount type shown in FIG. 28.

FIG. 26 is a schematic cross-sectional view showing the resin mold construction of the surface mount type piezoelectric vibrator 31 of the embodiment, FIG. 27 is a schematic perspective view showing the plural arrangement state of the surface mount type piezoelectric vibrator 31 of the embodiment on the lead frame 20, FIG. 28 is a schematic plan view for showing the resin mold construction of the embodiment. In addition, FIG. 29 is a partial enlarged view of FIG. 28.

In the resin molding process according to the embodiment, the piezoelectric vibrators 6 bonded to the electrode terminals 33 and the dummy terminals 32 on the lead frame 20 shown FIG. 25 are placed between the upper mold 40 and lower mold 41 shown in FIG. 26 and the molds are closed to form resin-molded sections 42 shown in FIG. 27.

In the lead frame 20 used for the resin molding process according to the embodiment, a side frame 22 and a frame area 26 for surface mount type piezoelectric vibrator 311 arrangement partitioned by a section bar 23 have no reinforcement frames and the like, which will correspond to a section bar 62 in a conventional lead frame 60. The resin molding process according to the embodiment can therefore be a resin molding process in which a plurality of surface mount type piezoelectric vibrators 31 are arranged on a single flat surface.

In other words, as shown in FIG. 26, cavities 42 are, for a resin molding upper mold 40, connected with one another through a single flat surface 44. Each of these cavities serves to form a periphery 43 surrounding a surface mount type piezoelectric vibrator 31. On the lead frame 20, the longitudinal directions of the lead sections for the dummy terminal 32 and electrode terminal 33 and the cavities are directed toward the side frame 22 while the piezoelectric vibrators are arranged in the direction of the section bar. The upper mold 40, where cavities 42 are connected with one another through a single flat surface 44, is located among frame areas 26 for surface mount type piezoelectric vibrator 31 arrangement on the lead frame 20, which are partitioned by side frames 22 and section bars 23. The upper mold 40 is brought into contact with the lower mold 41 to form peripheries 43 surrounding surface mount type piezoelectric vibrators 31. This then results in the formation of resin-molded surface mount type piezoelectric vibrators 31 on the lead frame 20, as shown in FIG. 27.

The longitudinal directions of the lead sections for the dummy terminal 32 and electrode terminal 33 and the cavities are directed toward the side frame while the piezoelectric vibrators are arranged in the direction of the section bar. Runners 45 for feeding molding resin in the resin molding process are therefore arranged at aright angle to the longitudinal direction of the lead frame 20, as shown in FIG. 28. The runners 45 are also disposed in the middle of the section bars 23 to feed resin to surface mount type piezoelectric vibrators 31 located on both sides of the runner, as shown in FIG. 29. Injection molding ports 46 are disposed on the electrode terminal 33 side of the surface mount type piezoelectric vibrators 31 on one of opposite sides of the runner 45. The injection molding ports 46 are also disposed on the dummy terminal 32 sides on the other side of the electrode terminal 33.

Runners 45 for feeding molding resin are disposed at a right angle to the longitudinal direction of the lead frame 20, thereby causing surface mount type piezoelectric vibrators 31 to be arranged on opposite sides of the runners 45.

In FIG. 28, a first left line of 20 surface mount type piezoelectric vibrators 31 are regarded as a first line, a line on the right of the first line as a second line and a line on the right of the second line as a third line. As shown in FIG. 29, the injection molding port 46 is provided on the dummy terminal 32 side for odd-numbered lines of surface mount type piezoelectric vibrators 31 and on the electrode terminal 33 side for even-numbered lines. If the direction made by the dummy terminal 32 side and the electrode terminal 33 side is defined as a back-and-forth direction of the surface mount type piezoelectric vibrator 31, injection molding ports 46 are in different back-and-forth directions for odd- and even-numbered lines of surface mount type piezoelectric vibrator 31.

On the lead frame 20, there are no frame bars for reinforcement of a conventional lead frame around the periphery 43 surrounding the surface mount type piezoelectric vibrator 31. Therefore, the upper mold 40 or the lower mold 41 for resin molding need not be placed astride the frame 63 for supporting a conventional section bar 62 and a lead terminal. Thus, runners 45 are disposed with good space efficiency and surface mount type piezoelectric vibrators 31 can be disposed in the frame area 26 with high density and with high cavity, thus allowing the accuracy of the molds to be maintained.

A surface mount type piezoelectric vibrator 31 will be described below with reference with FIG. 30.

Figure 30:
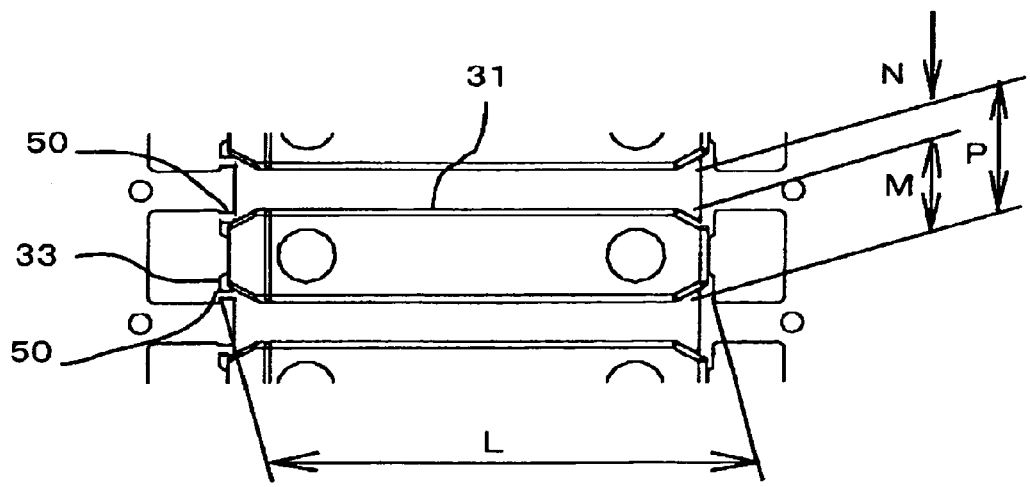
FIG. 30 is an enlarged plan view of the surface mount type piezoelectric vibrator shown in FIG. 28.

FIG. 30 is an enlarged plan view of a resin-molded surface mount type piezoelectric vibrator 31 of FIG. 28. Symbol L depicts a length. Symbol M depicts a width. Symbol N is a dimension of an adjacent surface mount type piezoelectric vibrator 31. Symbol P depicts a pitch. In the embodiment, the surface mount type piezoelectric vibrator 31 has a length L of 6.9 mm and a width M of 1.4 mm. The pitch P between surface mount type piezoelectric vibrators 31 is 2.0 mm. Therefore, symbol N is 0.6 mm. The dimension N between surface mount type piezoelectric vibrators 31 is 0.6 mm, smaller than the width M 0.8 mm and smaller the outside diameter of a sealing tube 5 of a piezoelectric vibrator 6 before resin molding. The height of the surface mount type piezoelectric vibrator 31 (not shown) is 1.4 mm. As described above, the surface mount type piezoelectric vibrator 31 has a width M that is about $\frac{1}{5}$ a length L. The pitch P is as small as possible and surface mount type piezoelectric vibrators 31 are arranged with high density in the frame area 26 on the lead frame 20.

Misalignment between the mold 41 for resin molding and the lead frame 20 can easily appear in the longitudinal direction of the surface mount type piezoelectric vibrator 31. The misalignment is caused by a difference in coefficient of linear expansion between the mold 41 for resin molding and the lead frame 20.

Center misalignment direction, which appears in the width direction of conventional surface mount type piezoelectric vibrator, is caused to appear in the misalignment-insensitive longitudinal direction of the surface mount type piezoelectric vibrator 31 as this embodiment. In addition, the contour of the molded resin close by the end 50 of the electrode terminal 33 of the surface mount type piezoelectric vibrator 31 is shaped like a slant face by the plan view as shown in FIG. 30. So, 2 parts of the end 50 to be cut which can prevent a cutting punch from coming into contact with molding resin. Therefore, resin chipping can be eliminated, which is caused by lead cutting in the process of cutting the dummy terminal 32 and the electrode terminal 33 due to center misalignment in the surface mount type piezoelectric vibrator 31.

In the resin mold construction according to the embodiment, a surface mount type piezoelectric vibrator 31 has characteristically a width M that is $\frac{1}{3}$ to $\frac{1}{5}$ smaller than length L thereof. Each of the surface mount type piezoelectric vibrators has two-directional terminals: one terminal functions as an electrode terminal 33 and the other is an electrically completely independent dummy terminal 32. The surface mount type piezoelectric vibrators can be arranged on the section 23 bar having a minimum configuration with no wasteful frame, in a matrix with high density over the entire lead frame 20. This is preferable for bringing the largest possible number of electrical contact terminals into contact with the piezoelectric vibrators in the electrical test process.

As described above, by the method described above, a resin mold construction for a surface mount type piezoelectric vibrator 31 is provided that makes it possible to simultaneously measure and test more of a plurality of surface mount type piezoelectric vibrators 31 all together quickly for low costs without resin chipping depending on molding material in the lead terminal portion cutting process, which results from the resin molding process, and without complicating resin molding molds with higher cavity density.

[Electrode Terminal Portion Cutting Process]

The resin molding process is followed by the, electrode terminal portion cutting process. The electrode terminal portion cutting process will be described below referring back to FIGS. 18 and 19.

As shown in FIG. 18, through holes 29 are provided on a centerline connecting the center of a first lead section 24 and a center of the second lead 25 in the lead frame 20 according to the embodiment. In the electrode terminal portion cutting process, slits are first cut in response to the number of through holes 29, each of which is open in a frame area 26 with the through holes 29 as an end point.

FIG. 19 is a plan. view showing a plurality of slits 30 cut in the lead frame 20. In FIG. 19, the contour of surface mount type piezoelectric vibrator 31 already arranged and fixed are shown in a dashed line to clearly show the shape of the lead frame 20.

As shown in FIG. 19, the width of the slit 30 is at least smaller than the interval at which surface mount type piezoelectric vibrators 31 are arranged and fixed and smaller than the diameter of the through hole 29.

If a slit 30 with a closed end is cut, a cutting tool on the closed end is subjected to a local load, which affects the service life of the cutting tool and makes a continued slit cutting work difficult. In the lead frame 20, however, through holes 29 are provided. Even if, therefore, slits 30 are cut from the central portion of the end of the first lead section 24 to the through hole 29, the cutting tool is not subjected to local load and slit cutting can be continued. If, similarly, slits 30 are cut from the central portion of the end of the second lead section 25 to the through hole 29, the cutting tool is not subjected to local load and slit cutting can be continued.

Slits 30 are cut because a notch groove 47 having a V-shaped cross section may be cut in the back surfaces of dummy terminal 32 and electrode terminal 33 to be at the end of the first and second lead sections 24, 25 supported by the section bar 23, as shown in FIG. 19. The notch groove 47 is cut to reduce load resulting from later cutting. If there are no slits 30 when the notch groove 47 is cut, a surface where the notch groove 47 on the lead frame 20 can expand, thus resulting in warpage to the surface where the notch groove 47 is cut.

The slit 30 is cut from the central portion of the first lead section 24 to the through hole 29 on the lead frame 20. When a notch groove 47 is cut, resulting lead from 20 deformation is therefore absorbed as local deformation in the thinned the first and second lead sections 24, 25, thus making it possible to prevent warpage to a surface the notch groove 47 is cut over the entire lead frame 20.

As shown in FIG. 19, if a notch groove 47 is cut where the tips of the adjacent first and second lead sections 24, 25 are connected to each other, a surface with the groove cut where the tips are connected to each other is expanded and warpage appears across the width of the lead frame 20 on the groove cutting surface side as harmful effect of notch groove cutting. Any warpage in the lead frame 20 makes it impossible to properly proceed with subsequent processes if the lead frame 20 is carried and aligned by means of a machine. A slit is therefore cut as shown in FIG. 19 so that any expansion of a notch groove 47 cutting surface where the tips are connected to each other is absorbed by the slit to prevent warpage across the width of the lead frame 20. For the above reason, slits 30 are cut in the electrode terminal portion cutting process before notch grooves 47 are cut.

As shown in FIG. 19, notch grooves 47 are then cut between a lower electrode terminal 33b and where slits are cut. After notch groove 47 cutting, soldering work is performed.

After soldering, electrode terminals 33 are then cut off from the lead frame with dummy terminals 32 left on the lead frame 20. As shown in FIG. 30, cutting is done to form a terminal cut portion 50 in a position corresponding to the notch groove 47 on the surface of the lead frame 20 and make the electrode terminal 33 electrically independent of the lead frame 20.

Cutting the electrode terminals 33 from the lead frame 20 in positions corresponding to notch grooves 47 with the dummy terminals 32 left on the lead frame 20 also allows electrical tests on the lead frame 20, which will be described later.

[Electrical Test Process]

Figure 31:
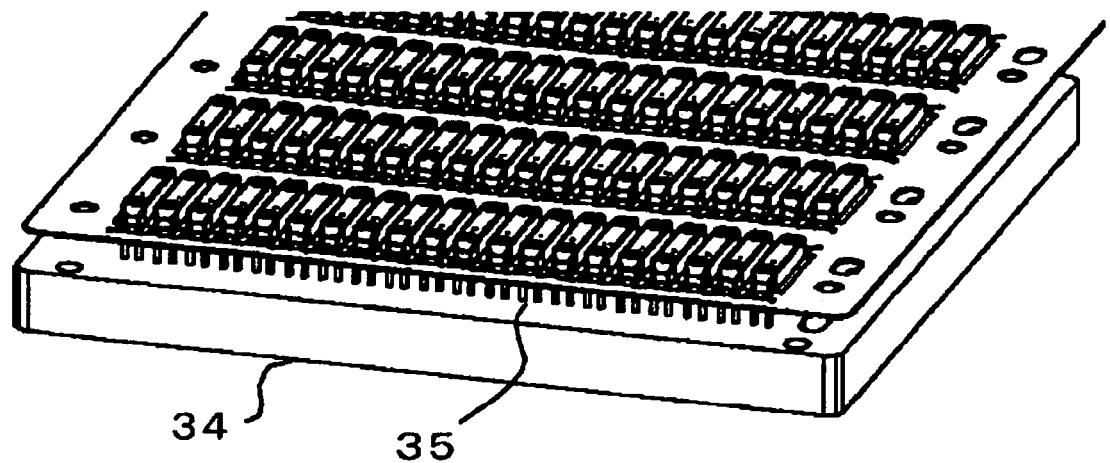
FIG. 31 is a schematic perspective view for describing the electrical test of the surface mount type piezoelectric related to the first embodiment.
Figure 32:
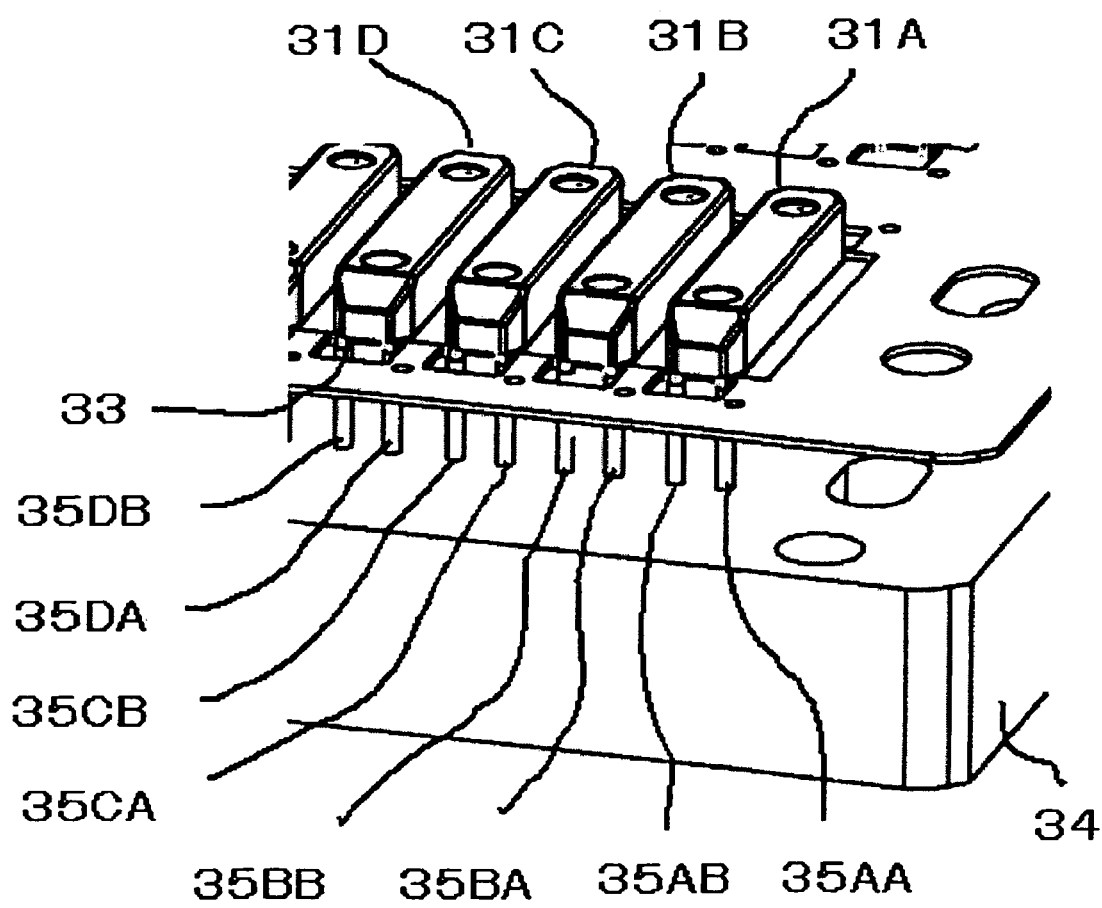
FIG. 32 is a partial enlarged view for describing FIG. 31.

FIG. 31 is a schematic-perspective view for describing an example of an electrical test according to the embodiment. FIG. 32 is a partial enlarged perspective view for describing FIG. 31. Note that no slits 30 cut in the preceding process are shown on the lead frame 20 in FIGS. 31 and 32.

As shown in FIG. 15, in the lead frame preparation process, on the lead frame 20, a surface mount type piezoelectric vibrator 31 characteristically has a width that is ⅓ to ⅕ smaller than the length thereof. Each of the surface mount type piezoelectric vibrators has two-directional terminals: one terminal functions as an electrode terminal 33 and the other is an electrically completely independent dummy terminal 32. The surface mount type piezoelectric vibrators can be arranged on the section bar 23 having a minimum configuration with no wasteful frame, in a matrix with high density over the entire lead frame 20. The largest possible number of electrical contact terminals 35 can be brought into contact with the piezoelectric vibrators.

As shown in FIG. 21, in the process for bonding the outer lead 3 and the electrode terminal 33, the electrode terminals 33 are arranged on the lead frame 20 and the outer leads 3 are arranged on the carriage pallet 10, with stable positional accuracy guaranteed by the lead frame 20 and the carriage pallet 10, thus providing stable bonding.

As shown in FIG. 26, in the resin molding process, a resin mold construction with the arrangement of surface mount type piezoelectric vibrators 31 is provided that allows bringing more electrical contact terminals 35 into contact with surface mount type piezoelectric vibrators and simultaneously measuring and testing more surface mount type piezoelectric vibrators all together quickly without complicating resin molding molds 40, 41 with higher cavity density for adjacent surface mount type piezoelectric vibrators 31.

Use of the manufacturing process described above makes it possible to bring more electrical contact terminals 35 into contact with a plurality of surface mount type piezoelectric vibrators 31 formed on the lead frame 20 all together. Therefore, more surface mount type piezoelectric vibrators 31 can be measured simultaneously and quickly all together in test operations, in which must time is conventionally spent because of more measurement items for guaranteeing performance characteristics and measuring accuracy. Resulting saved time can be allocated to measurements for performance characteristic measurement items for measurement accuracy guarantee, thus making it possible to ensure a higher reliability and a higher quality in each of the lead frame preparation process, the bonding process, and resin molding process.

As shown in, FIG. 30, terminal cut portions 50 are formed by separating plurality of surface mount type piezoelectric vibrator electrode terminal 33 rows resin molded with high density on the lead frame 20 shown in FIG. 22. With surface mount type piezoelectric vibrator 31 with terminal cut portions 50 formed electrically independent by the terminal cut portion 50 on the lead frame 20, electrical contact terminals 35 on an electrical test measurement block 34 are brought into contact with surface mount type piezoelectric vibrators, as shown in FIGS. 31 and 32.

The electrical test measurement block 34 is made from the electrical insulating material and has the plate-shape, thereby being fixed by inserting the electrical contacting terminal 35 into the penetrated hole. The electrical contacting terminal 35 is being connected the driver circuit that oscillates the surface mount type piezoelectric vibrator 31 and the frequency measurement circuit (not shown) through the wire drawn from the reverse side of measuring bonding side.

Drive voltage is then applied to the electrical contact terminal 35 to cause the surface mount type piezoelectric vibrator 31 to oscillate. Electrical tests are performed on the surface mount type piezoelectric vibrators 31 formed on the lead frame 20. In other words, surface mount type piezoelectric vibrators 31 are electrically tested to distinguish acceptable electrodes and unacceptable electrodes by applying predetermined current to each of the electrode terminals 33 electrically independent on the lead frame 20.

According to results of electrical tests, identification marks are printed on the contour of the surface mount type piezoelectric vibrator 31 through a laser marker. These marks are divided into types such as load capacity as serial equivalent static capacity and frequency deviation.

Surface mount type piezoelectric vibrators 31 can identified in types, such as between load capacity as serial equivalent static capacity and frequency deviation.

Individual surface mount type piezoelectric vibrators 31 identified are then handled much more quickly in a process for mounting the surface mount type piezoelectric vibrator 31 on a tape and the like than in measurements in electrical tests. Various characteristics can also be processed quickly in terms of user applications such as high accuracy in the electrical test process.

For electrical contact terminals 35 brought into contact with surface mount type piezoelectric vibrators 31 all together, one level of oscillating drive voltage is made to alternate with another for every other surface mount type piezoelectric vibrator 31 to alternately measure every other surface mount type piezoelectric vibrator 31.

As shown in FIG. 32, when the electrical contacting terminals 35AA and 35AB are bonded to the electrode terminal 33 of the surface mount type piezoelectric vibrator 31A, the oscillating driver circuit and frequency measurement circuit is connected to the surface mount type piezoelectric vibrator 31A. Correspondingly, when the electrical contacting terminal 35BA, 35BB, 35CA, 35CB, 35DA and 35DB are bonded to the surface mount type piezoelectric vibrators 31B, 31C and 31D, the oscillating driver circuit and frequency measurement circuit are the surface mount type piezoelectric vibrator 31B, 31C and 31D, respectively.

Every other surface mount type piezoelectric vibrators 31B and 31D are continuously driven in the applying level of driving voltage provoking the oscillation lower than mere level. Every other surface mount type piezoelectric vibrators 31A and 31C, which are the measuring targets, are driven and measured in the applying level of the driving voltage as same as the normal level.

After the measurement of the surface mount piezoelectric vibrator 31A and 31C which are the measurement targets is terminated, the surface mount type piezoelectric vibrators 31A and 31C are continuously driven in the applying level of driving voltage provoking the oscillation lower than mere vibrating level, while every other surface mount type piezoelectric vibrators 31B and 31D, which are the measuring targets, are driven and measured in the applying level of the driving voltage as same as the normal level.

As described above, the adjacent surface mount type piezoelectric vibrators are continuously driven in the applying level of driving voltage provoking the driving lower than mere vibrating level, whereby the surface mount type piezoelectric vibrator which is the measurement targets is not influenced by the frequency. Further, driving in the normal applying level can shorten the time until the frequency is stabilized.

The alternate measurement described above makes it possible to test more of a plurality of surface mount type piezoelectric vibrators 31 with the electrical contact terminals 35 in contact with the surface mount type piezoelectric vibrator 31. This eliminates the necessity of repeatedly bringing an electrical contact terminals 35 into contact with each one of the surface mount type piezoelectric vibrator 31 arranged at short pitches on the lead frame 20.

The measurement of more surface mount type piezoelectric vibrator 31 allows a great reduction in time for measuring surface mount type piezoelectric vibrator 31. The measurement time reduction enables resulting saved time to be allocated to measurements for performance characteristic measurement items for measurement accuracy guarantee, thus making it possible to produced surface mount type piezoelectric vibrators 31 each having ensured reliability and quality.

After the end of measurements, dummy terminals 32 are cut to obtain individual separate surface mount type piezoelectric vibrators 31. Each surface mount type piezoelectric vibrators 31 is taped according to an identification mark thereon for shipment, which marks are classified as types such as load capacity as serial equivalent static capacity and frequency deviation.

As described above, the surface mount type piezoelectric vibrator has two-directional terminals and characteristically a width that is $\frac{1}{3}$ to $\frac{1}{5}$ smaller than the length thereof. These surface mount type piezoelectric vibrators are arranged on the section bar in a matrix with high density on the lead frame. The largest possible number of electrical contact terminals are brought into contact with these piezoelectric vibrators. These surface mount type piezoelectric vibrators are simultaneously measured all together with quick testing for each of the vibrators.

A plurality surface mount type piezoelectric vibrators 31 are arranged with high density. More of the surface mount type piezoelectric vibrators are simultaneously tested with electrical contact terminals in contact with the surface mount type piezoelectric vibrators without repeated electrical contact terminal contacts, and without any influence on the frequency of adjacent vibrators. Resulting saved time is allocated to measurements for performance characteristic measurement items for measurement accuracy guarantee, thus allowing reliability and quality improvements.

Second Embodiment

Figure 33:
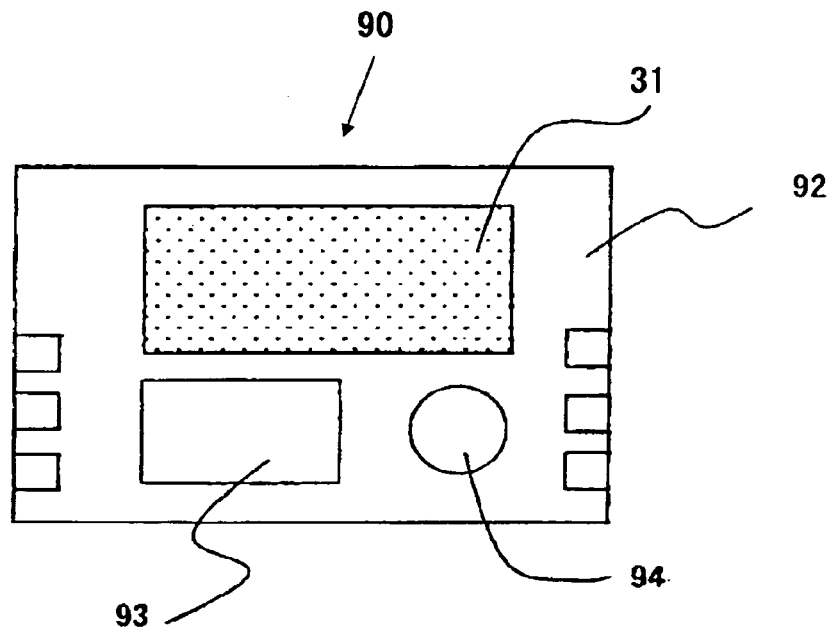
FIG. 33 is a schematic pattern view showing the example of the construction of the turning-fork quartz crystal oscillator related to the second embodiment of the invention.

A second embodiment according to the invention will be described below with reference with FIG. 33. FIG. 33 is a schematic pattern diagram showing an example of the configuration of a tuning fork type quartz crystal oscillator according to a second embodiment of the invention. The tuning fork type quartz crystal oscillator 90 uses the surface mount type piezoelectric vibrator 31 described above as an oscillation piece and is connected to an integrated circuit.

In FIG. 33, a surface mount type piezoelectric vibrator 31 is set in a predetermined position on a substrate 92 and an integrated circuit for an oscillator indicated by a reference numeral 93 is provided adjacent to the surface mount type piezoelectric vibrator 31. An electronic part 94 such as a capacitor is also mounted. These parts are electrically connected together through a wiring pattern not shown. The mechanical vibration of the vibrating piece of the surface mount type piezoelectric vibrator 31 is converted into an electrical signal due to the piezoelectric properties of a quartz crystal and input into an integrated circuit 93. In the integrated circuit 93, signal processing is performed and a frequency signal is output. The circuit functions as an oscillator. Each of these components is molded of resin not shown. A proper selection of the integrated circuit 93 provides a function to control the operating date for a single-function oscillator, and other systems of interest and external systems and to provide a user with time and calendar information.

Using the surface mount type piezoelectric vibrator 31 produced by the method according to the present invention makes it possible to further reduce the size of a vibrator having the largest volume in the oscillator and therefore the size of the oscillator. Reliability can also be maintained for a long period of time.

Third Embodiment

Figure 34:
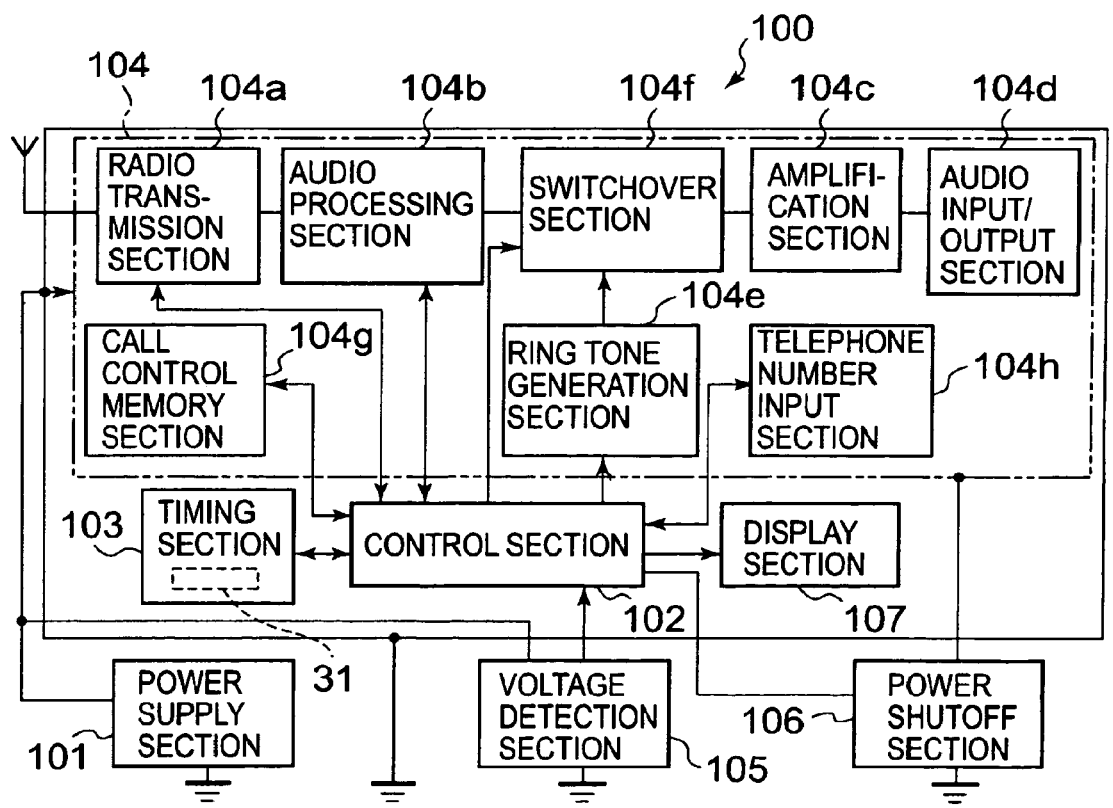
FIG. 34 is a schematic view showing one example of the block diagram of portable information device related to the third embodiment of the invention.

A third embodiment of the present invention will be described below. The third embodiment is an example of an electronic unit using a surface mount type piezoelectric vibrator 31 produced by the method according to the present invention with the vibrator connected to a timing section. As an example of an electronic unit, a preferred embodiment of a portable information unit represented by a cell phone will be will be described below with reference to the drawings. FIG. 34 is a block diagram functionally showing the configuration of a portable information unit according to the embodiment.

A portable information unit 10 is a developed and improved version of a watch produced by means of related art. The portable information unit is similar to a watch in appearance. The portable information unit has a liquid crystal display, instead of an hour plate, which can display current time on a screen thereof. When the portable information unit is used as a communications unit, the portable information unit is removed from the wrist. A loud speaker and a microphone each incorporated inside a band section can be used to make communications as with a cell phone produced by related art. The portable information unit is much smaller and light-weighted than a conventional cell phone.

In FIG. 34, a reference numeral 101 depicts a power supply section for supplying each of the functional sections described later with power, which section is specifically provided by a lithium ion secondary battery. A control section 102, a time keeping section 103, a communications section 104, a voltage detection section 105 and a display section 107 are connected in parallel to the power supply section 101, all of which will be described later. Power is fed to each of these functional sections from the power supply section 101.

The control section 102 controls each of the functional sections, which will be described later, to control the operation of the entire system, such as audio data transmission and reception as well as current-time measurement and display. The control section 102 is specifically provided by a program written into ROM in advance, a CPU for reading and executing the program, and a RAM used as a work area for the CPU, and the like.

The time keeping section 103 is composed of an integrated circuit having built therein an oscillation circuit, a register circuit, a counter circuit, and an interface circuit and a surface mount type piezoelectric vibrator 31 as shown in FIGS. 2 or 3. The mechanical vibration of the surface mount type piezoelectric vibrator 31 is converted into an electrical signal due to the piezoelectric properties of a quartz crystal and input into the oscillation circuit formed of a transistor and a capacitor. The out of the oscillation circuit is binarized and counted by the register circuit and the counter circuit. A signal is transmitted to and received from the control section via the interface circuit and current time and current date or calendar information are displayed on the display section 107.

The communications section 104 has a similar function to a related-art cell phone. The communications section 104 is composed of a radio transmission section 104a, an audio processing section 104b, an amplification section 104c, an audio input/output section 104d, an incoming sound generation section 104e, a switching section 104f, a call control memory 104g, and a phone number input section 104h.

The radio transmission section 104a transmits and receives various data to and from a base station through an antenna. The audio processing section 104b codes/decodes an audio signal inputted from the radio transmission section 104a or an amplification section 104c described later. The amplification section 104c amplifies a signal inputted from the audio processing section 104b or the audio input/output section 104d described later to a predetermined level. Specifically, the audio input/output section 104d is a speaker or a microphone and it amplifies ring tone or receiving voice or collects speaker's voice.

The incoming sound generation section 104e produces an incoming sound in response to a call from a base station. The switching section 104f switches the amplification section 104c connected to the audio processing section 104b to the incoming sound generation section 104e in the present of an incoming call so that an incoming sound produced is outputted to the audio input/output section 104d via the amplification section 104c.

The call control memory 104g stores a program related to communication in coming and out going all control. In addition, the phone number input section 104h is specifically composed of number keys from 0 to 9 and some other keys and input a call receiver's phone number and the like.

The voltage detection section 105 detects a voltage drop if the voltage applied by the power supply section 101 to each of the functional sections including the control section 102 falls below a predetermined value and then notifies the control section 102. The predetermined value is a value that is preset as the minimum voltage required for the stable operation of the communications section 104 and is a voltage of 3V or so, for example. If notified of a voltage drop by the voltage detection section 105, the control section 102 prohibits the operation of the radio transmission section 104a, the audio processing section 104b, the switching section 104f, and the incoming sound generation section 104e. Particularly, the stop of the operation of the radio transmission section 104a with large power consumption is essential. At the same time, the display section 107 displays a message to the effect that the communications section 104 has become unavailable due to a shortage of remaining power in the battery.

The operation of the communications section 104 is prohibited via the cooperation of the voltage detection section 105 and the control section 102. A message to that effect can also be displayed by the display section 107.

In the embodiment of the present invention, the power supply section related to the function of the communications section is provided with a selectively interruptable power supply interruption section 106, thereby making it possible to stop the function of the communications section more perfectly.

A text message may be used to display a message to the effect that the communications section 104 has become unavailable. A more visceral method for marking a phone icon with X on the display section 107, for example, may be used.

Using a small surface mount type piezoelectric vibrator 31 produced by means of a method according to the present invention in a portable information unit makes it possible to further reduce the size of the portable electronic unit, thus making it possible to keep portable electronic units reliable for a long period of time.

Fourth Embodiment

Figure 35:
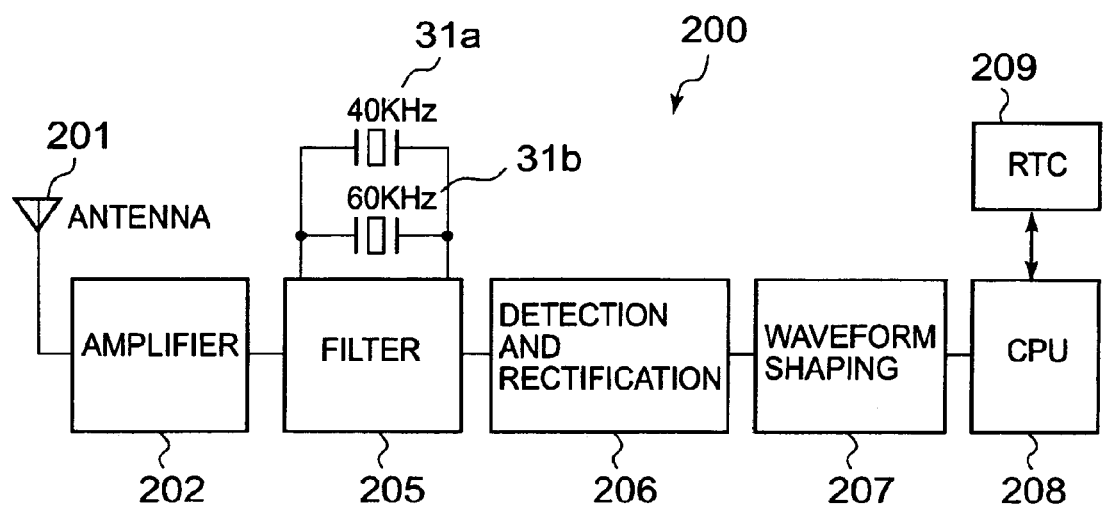
FIG. 35 is a schematic view showing one example of the block diagram of the wave clock related to the fourth embodiment of the invention.
Figure 36:
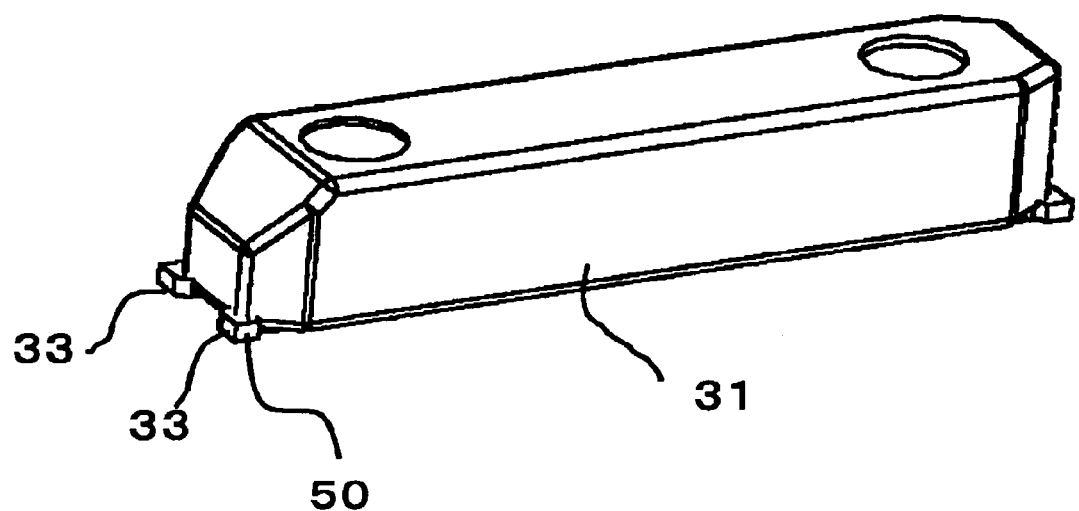
FIG. 36 is a perspective view showing an appearance of the surface mount type piezoelectric vibrator.

FIG. 35 is a schematic diagram showing the circuit block of a wave watch as an electronic unit according to a fourth embodiment of the present invention. The wave timepiece 201 shows an example of two surface mount type piezoelectric vibrators 31 connected to the filter section of the wave watch.

A wave watch 201 is a watch provided with a function to receive and automatically correct a standard wave including time information to an accurate time and display the correct time. In Japan there are two transmitting stations (broadcasting stations) for transmitting a standard wave: one is in Fukushima Prefecture (40 KHz) and the other in Saga Prefecture (60 KHz). A long wave of 40 or 60 KHz has both a property of propagating along the earth surface and a property of propagating reflecting to the ionized layer and the earth surface. The long wave therefore has a wide propagation range and the long waves from the above two transmitting stations together cover the entire country.

In FIG. 35, an antenna 201 receives a long standard electric wave of 40 or 60 KHz. The long standard electric wave is a 40 or 60 Hz carrier wave subjected to AM modulation with time information called time code.

The long standard electric wave received is amplified by an amplifier 202 and filtered and synchronized by a filter section 205 including surface mount type piezoelectric vibrators 31a, 31b each having the same resonance frequency as the two carrier frequency. A filtered signal having a predetermined frequency is detected and demodulated by a wave detection and rectification circuit 206. A time code is taken out by a waveform formation circuit 207 and counted by a CPU 208. The CPU 208 then reads information such as the current year, accumulated days, day of the week, and time. The information read is reflected to an RTC 209 and an accurate time information is displayed.

Since the carrier has a frequency of 40 KHz or 60 KHz, a vibrator having a configuration shaped like a tuning fork is preferable for the surface mount type piezoelectric vibrators 31a, 31b which constitutes the filter section. With 60 KHz taken as an example, it is possible to configure a tuning fork type quartz crystal vibrating piece having a full length of approximately 2.8 mm and a base with a width of approximately 0.5 mm.

A surface mount type piezoelectric vibrator 31 produced by means of a method according to the present invention is connected to the filter section of the wave watch, thereby making it possible to further reduce the size of the wave watch. In addition, this allows the filter function of the wave watch to operate over along period of time while keeping good accuracy.

What is claimed is:

1. A surface mount type piezoelectric vibrator, comprising:
   a piezoelectric vibrator having a piezoelectric vibrating piece bonded to an airtight terminal with a lead terminal and sealed by a cylindrical bottomed metal sealing tube;
   an electrode terminal connected to the lead terminal; and
   a mold resin coating the piezoelectric vibrator;
   wherein a tip of the electrode terminal is disposed approximately at the same position as a tip of the lead terminal in a longitudinal direction of the surface mount type piezoelectric vibrator.

2. A surface mount type piezoelectric vibrator according to claim 1; wherein the electrode terminal comprises an upper electrode terminal portion connected to a lower surface of the lead terminal and a lower electrode terminal disposed on a lower surface of the surface mount type piezoelectric vibrator; and wherein a tip of the lower electrode terminal is disposed approximately at the same position as the tip of the lead terminal in the longitudinal direction of the surface mount type piezoelectric vibrator.

3. A surface mount type piezoelectric vibrator according to claim 2; wherein the electrode terminal is generally U-shaped.

4. A surface mount type piezoelectric vibrator according to claim 3; wherein the mold resin coating the piezoelectric vibrator forms a body of the surface mount type piezoelectric vibrator; and wherein the upper electrode terminal is disposed in a width direction of the body of the surface mount type piezoelectric vibrator without overlapping the lower electrode terminal.

5. A surface mount type piezoelectric vibrator according to claim 4; wherein the upper electrode terminal is disposed closer to a central longitudinal axis of the piezoelectric vibrator than the lower electrode terminal.

6. An oscillator comprising: an oscillation piece; and a surface mount type piezoelectric vibrator according to claim 1 connected to the oscillation piece for vibrating the oscillation piece.

7. An electronic unit comprising: a timing section; and a surface mount type piezoelectric vibrator according to claim 1 connected to the timing section.

8. A wave clock comprising: a filter section; and a surface mount type piezoelectric vibrator according to claim 1 connected to the filter section.

9. A surface mount type piezoelectric vibrator comprising:
a piezoelectric vibrator having a piezoelectric vibrating piece bonded to an airtight terminal with a lead terminal and sealed by a cylindrical bottomed metal sealing tube;
a mold resin coating the piezoelectric vibrator; and
an electrode terminal connected to the lead terminal so that a tip of the electrode terminal is disposed approximately at the same position as a tip of the lead terminal in a longitudinal direction of the surface mount type piezoelectric vibrator, the electrode terminal having a vertical section disposed adjacent to an end of the piezoelectric vibrator, an upper electrode terminal extending from an upper side of the vertical section in a direction away from the end of the piezoelectric vibrator, and a lower electrode terminal extending from a lower side of the vertical section in the direction away from the end of the piezoelectric vibrator, the upper electrode terminal being disposed in a width direction of the piezoelectric vibrator without overlapping the lower electrode terminal.

10. A surface mount type piezoelectric vibrator according to claim 9; wherein the upper electrode terminal is disposed closer to a central longitudinal axis of the piezoelectric vibrator than the lower electrode terminal.

11. A surface mount type piezoelectric vibrator comprising:
a piezoelectric vibrator comprised of an airtight terminal, a pair of mount electrodes formed on a surface of the airtight terminal, a pair of lead terminals extending through the airtight terminal and connected to the respective mount electrodes, a piezoelectric vibrating piece having a pair of arm portions, a pair of exciting electrodes formed on the respective arm portions of the piezoelectric vibrating piece, and a sealing tube connected to the airtight terminal so that the airtight terminal is airtight sealed to provide a vacuum chamber containing the piezoelectric vibrating piece;
a mold resin coating the piezoelectric vibrator; and
a pair of electrode terminals connected to the respective lead terminals of the piezoelectric vibrator.

12. A surface mount type piezoelectric vibrator according to claim 11; wherein each of the electrode terminals comprises a vertical section disposed adjacent to an end of the piezoelectric vibrator, an upper electrode terminal extending from an upper side of the vertical section in a direction away from the end of the piezoelectric vibrator, and a lower electrode terminal extending from a lower side of the vertical section in the direction away from the end of the piezoelectric vibrator.

13. A surface mount type piezoelectric vibrator according to claim 12; wherein for each of the electrode terminals, the upper electrode terminal is disposed in a width direction of the piezoelectric vibrator without overlapping the lower electrode terminal.

14. A surface mount type piezoelectric vibrator according to claim 12; wherein for each of the electrode terminals, the upper electrode terminal is disposed closer to a central longitudinal axis of the piezoelectric vibrator than the lower electrode terminal.

15. A surface mount type piezoelectric vibrator according to claim 11; wherein tips of the electrode terminals are disposed approximately at the same position as tips of the respective lead terminals in a longitudinal direction of the piezoelectric vibrator.

16. A surface mount type piezoelectric vibrator according to claim 11; wherein end surfaces at tips of the electrode terminals are generally coplanar with end surfaces at tips of the respective lead terminals.

17. An oscillator comprising: an oscillation piece; and a surface mount type piezoelectric vibrator according to claim 11 connected to the oscillation piece for vibrating the oscillation piece.

18. An electronic unit comprising: a timing section; and a surface mount type piezoelectric vibrator according to claim 11 connected to the timing section.

19. A wave clock comprising: a filter section; and a surface mount type piezoelectric vibrator according to claim 11 connected to the filter section.

20. A surface mount type piezoelectric vibrator according to claim 11; wherein each of the electrode terminals is generally U-shaped.

* * * * *